United States Patent
Tsunoda

(10) Patent No.: US 9,565,015 B1
(45) Date of Patent: Feb. 7, 2017

(54) SIGNAL REPRODUCTION CIRCUIT, ELECTRONIC APPARATUS, AND SIGNAL REPRODUCING METHOD

(71) Applicant: FUJITSU LIMITED, Kawasaki-shi, Kanagawa (JP)

(72) Inventor: Yukito Tsunoda, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/211,079

(22) Filed: Jul. 15, 2016

(30) Foreign Application Priority Data

Sep. 9, 2015 (JP) ................ 2015-177602

(51) Int. Cl.
| | |
|---|---|
| H03D 3/24 | (2006.01) |
| H04L 7/033 | (2006.01) |
| H04L 7/00 | (2006.01) |
| H03L 7/087 | (2006.01) |
| H03L 7/08 | (2006.01) |
| H03L 7/14 | (2006.01) |

(52) U.S. Cl.
CPC ............ *H04L 7/0331* (2013.01); *H03L 7/087* (2013.01); *H03L 7/0807* (2013.01); *H03L 7/143* (2013.01); *H04L 7/0087* (2013.01)

(58) Field of Classification Search
CPC .......... H03L 7/087; H03L 7/07; H03L 7/0891; H03L 2207/06; H03L 7/0807; H03L 7/143; H04L 7/033; H04L 7/0331; H04L 7/0087

See application file for complete search history.

(56) References Cited

U.S. PATENT DOCUMENTS

| | | | | |
|---|---|---|---|---|
| 5,414,741 A | * | 5/1995 | Johnson | H03D 3/245 331/18 |
| 5,838,205 A | * | 11/1998 | Ferraiolo | H03L 7/07 327/147 |

(Continued)

FOREIGN PATENT DOCUMENTS

| | | |
|---|---|---|
| JP | 6-216765 | 8/1994 |
| JP | 11-355111 | 12/1999 |

(Continued)

OTHER PUBLICATIONS

Ansgar Pottbäcker et al., "A Si Bipolar Phase and Frequency Detector IC for Clock Extraction up to 8 Gb/s", IEEE Journal of Solid-State Circuits, vol. 27, No. 12, Dec. 1992, pp. 1747-1751.

*Primary Examiner* — Khanh C Tran
(74) *Attorney, Agent, or Firm* — Staas & Halsey LLP

(57) ABSTRACT

A signal reproduction circuit includes: an oscillator generating first clock and second clock having a same frequency but different phases; and a feedback circuit to control the oscillator in accordance with a phase relation and a frequency relation between input data and the first clock, wherein the feedback circuit includes: a frequency-phase detection circuit to compare a clock phase control signal and a clock phase detection signal and generate a frequency phase signal indicating the frequency relation between the input data and the first clock, a state detection circuit to detect a lock state in which falling edges or rising edges of the input data and the first clock synchronize and a frequency difference state in which frequencies of the input data and the first clock are different, and a selector to supply the frequency phase signal to the feedback loop only in the frequency difference state.

6 Claims, 19 Drawing Sheets

(56) References Cited

U.S. PATENT DOCUMENTS

| | | | | |
|---|---|---|---|---|
| 7,646,840 | B2* | 1/2010 | Hoffmann | G11C 7/1078 375/376 |
| 9,036,764 | B1* | 5/2015 | Hossain | H03L 7/087 375/355 |
| 2002/0051510 | A1 | 5/2002 | Noguchi | |
| 2002/0061087 | A1* | 5/2002 | Williams | G11B 20/10055 375/376 |
| 2002/0061088 | A1* | 5/2002 | Kon | G11B 20/1403 375/376 |
| 2006/0250192 | A1* | 11/2006 | Hsieh | H03L 7/087 331/16 |
| 2007/0058768 | A1* | 3/2007 | Werner | H03D 13/004 375/376 |
| 2009/0122939 | A1* | 5/2009 | Hoang | H03K 19/17732 375/375 |

FOREIGN PATENT DOCUMENTS

| | | |
|---|---|---|
| JP | 2002-135093 | 5/2002 |
| JP | 2010-141594 | 6/2010 |

* cited by examiner

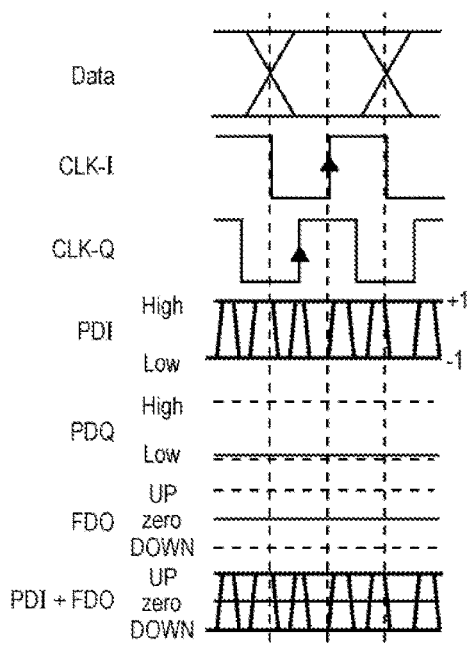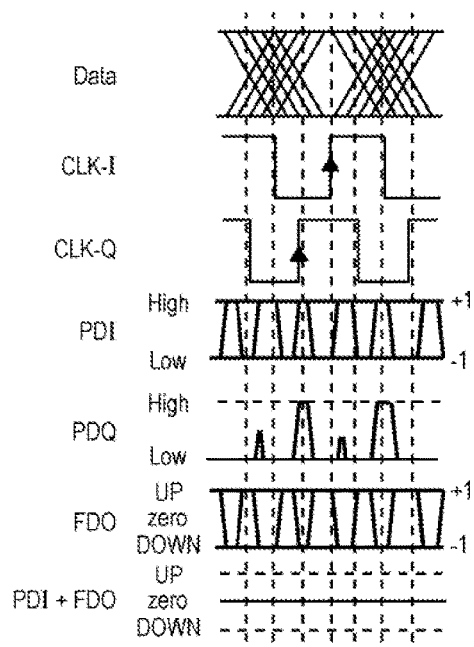

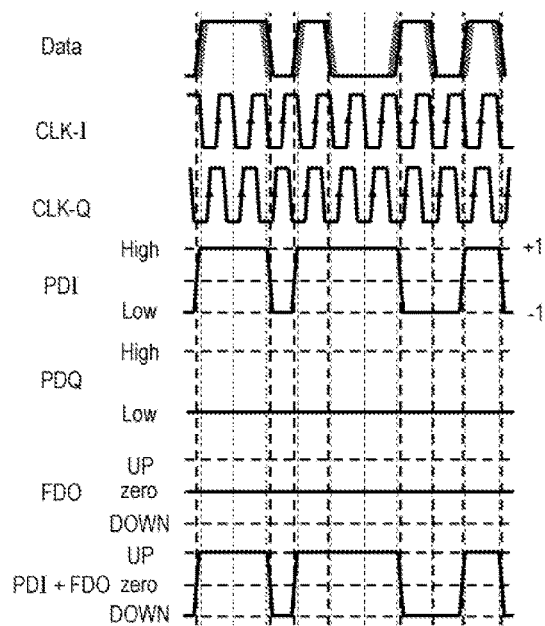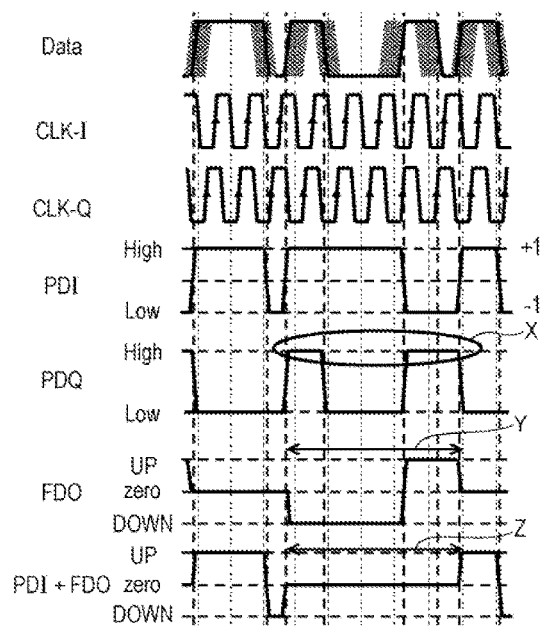

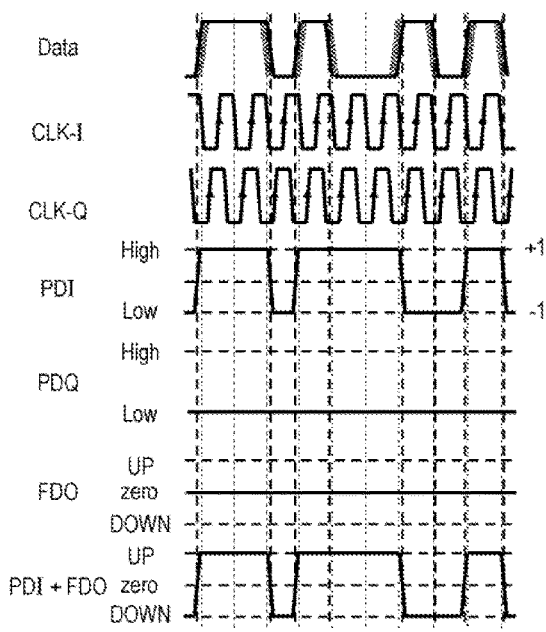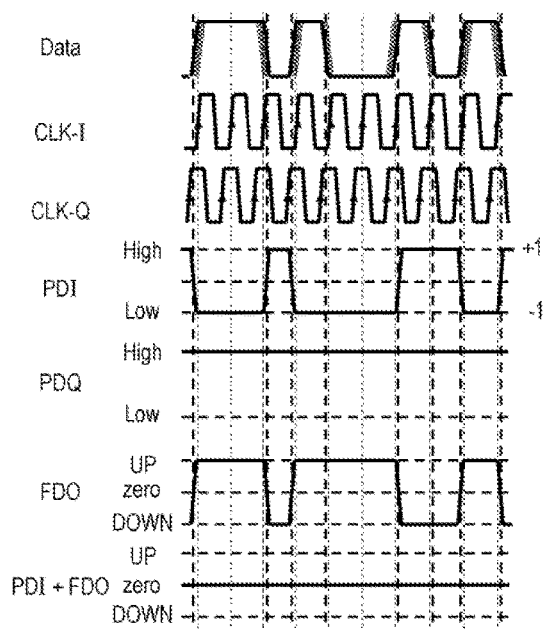

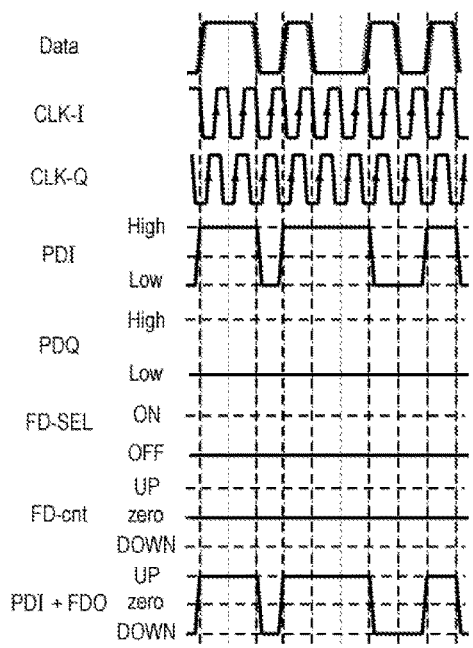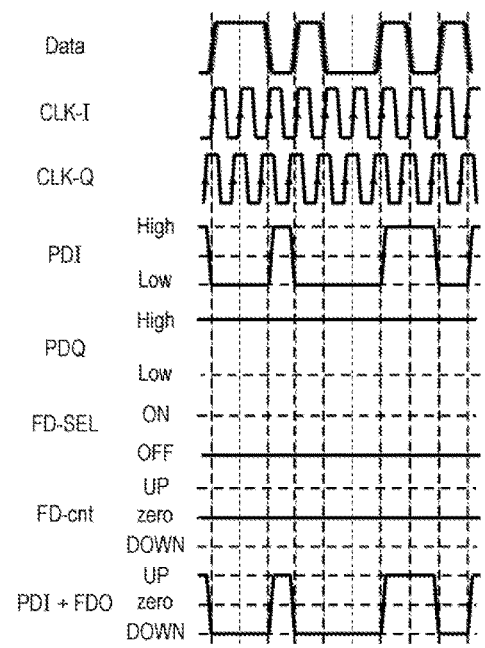

SIGNAL REPRODUCTION CIRCUIT, ELECTRONIC APPARATUS, AND SIGNAL REPRODUCING METHOD

CROSS-REFERENCE TO RELATED APPLICATION

This application is based upon and claims the benefit of priority of the prior Japanese Patent Application No. 2015-177602, filed on Sep. 9, 2015, the entire contents of which are incorporated herein by reference.

FIELD

The embodiments discussed herein are related to a signal reproduction (clock data recovery (CDR)) circuit, an electronic apparatus including the signal reproduction circuit, and a signal reproducing method.

BACKGROUND

An increase in a data rate of signal transmission and reception inside and outside an apparatus has been desired in relation to the improvement in performance of information processing apparatuses such as an apparatus for trunk communications and a server. A further increase in a bit rate has been desired in, for example, the field of high-speed I/O for transmitting and receiving signals in an integrated circuit chip and between chips (in an apparatus and between apparatuses) and the field of optical communication.

A reception circuit desirably determines transmitted data at an appropriate time and reproduces data and a clock (CDR: clock and data recovery). The CDR is realized by detecting a phase difference and a frequency difference between input data and a reception (sampling) clock and performing, based on information of the phase difference and the frequency difference, phase adjustment of the sampling clock. Among reception circuits, there is known a CDR circuit that retimes input data using a clock reproduced from the input data without using a reference clock and outputs data with reduced jitter.

It is known that the CDR circuit utilizes a phase detection circuit (a phase detector (PD)) that detects a phase difference between the input data and the clock. The CDR circuit using only the phase detector has a problem that a frequency range in which the clock is reproducible is narrow. Therefore, a CDR circuit utilizing a phase-frequency detection (phase frequency detector (PFD)) circuit that detects a frequency relation between the input data and the clock in addition to the phase difference between the input data and the clock is used.

The CDR circuit includes a feedback control circuit including an oscillator having a variable oscillation frequency (e.g., a voltage controlled oscillator (VCO)), a phase-frequency detection circuit, a charge pump (CP), and a loop filter (LPF). The filter LPF is a low pass filter. However, the filter LPF is included in a feedback loop, the filter LPF is called loop filter as well. The phase-frequency detection circuit detects a phase difference and a frequency relation between the input data and the clock and generates a phase difference signal and a frequency phase difference signal. The charge pump and the loop filter perform addition/subtraction of electric currents in accordance with phase difference information and frequency phase difference information and generate a control voltage of the VCO. In other words, the charge pump and the loop filter form a controller of the feedback control circuit. The VCO changes the oscillation frequency in accordance with the control voltage and outputs a clock. The generated clock is supplied to a decision circuit. The decision circuit captures input data in response to the clock, the time of which is adjusted with respect to the input data. The decision circuit may be formed as a part of the phase-frequency detection circuit.

Various phase-frequency detection circuits have been proposed. For example, for high-speed data reception, a differential phase-frequency detection circuit relatively small in circuit size including first and second phase detection circuits and a frequency phase detection circuit is widely used. The first phase detection circuit generates a clock phase control signal based on a phase relation between input data and a first clock. The first phase detection circuit is formed by, for example, two latch circuits, which latch the first clock at a change edge of the input data, and a multiplexer. An output of the multiplexer serves as a clock phase control signal. The second phase detection circuit includes a circuit configuration same as the circuit configuration of the first phase detection circuit and generates a clock phase detection signal based on a phase relation between input data and a second clock. The second clock has a frequency the same as the frequency of the first clock and has a phase different from the phase of the first clock by, for example, 90 degrees. The second clock is outputted from the VCO together with the first clock or is generated by phase-shifting the first clock with a phase shifter.

The frequency-phase detection circuit is formed by two latch circuits, which latch the clock phase detection signal outputted by the second phase detection circuit at a change edge of the clock phase control signal outputted by the first phase detection circuit, and a multiplexer. The multiplexer generates, from a direction of the change edge of the clock phase control signal and a latched value, a frequency phase signal indicating whether the frequency of the first clock is small or large with respect to the frequency of the input data. The frequency phase signal indicates +1 when the frequency of the first clock is small with respect to the frequency of the input data, indicates −1 when the frequency of the first clock is large with respect to the frequency of the input data, and indicates 0 when the frequency of the first clock is the same as the frequency of the input data. The clock phase control signal and the frequency phase signal are supplied to the charge pump. That is, the VCO is controlled based on the clock phase control signal and the frequency phase signal.

When the frequency difference between the input data and the first clock decreases and the input data and the first clock coincide with each other, the frequency phase signal becomes zero and the control of the VCO is not affected by the frequency phase signal. In other words, the VCO is controlled in accordance with only the clock phase control signal and the VCO is controlled to be in a state in which the input data and the first clock have a predetermined phase difference. This state is referred to as a lock state.

Providing a selector that performs switching is also proposed. The selector supplies the frequency phase signal to the charge pump until the frequency phase signal becomes zero and supplies the clock phase control signal to the charge pump after the frequency phase signal reaches a fixed value.

Even in the lock state, during reception of a signal having large jitter, the frequency phase signal may fluctuate and the frequency-phase detection circuit may malfunction and output a clock phase detection signal indicating that the frequencies of the input data and the first clock do not coincide with each other. When such a clock phase detection signal is inputted to the charge pump, the control of the VCO temporarily changes, and a loss-of-synchronization (unlock)

error indicating that the frequency of the first clock is different from the frequency of the input data occurs.

In a normal lock state, the CDR circuit is controlled such that one change edge (a falling edge here) of the first clock coincides with a change edge of the input data. However, even when the other change edge (a rising edge) of the first clock coincides with the change edge of the input data, the CDR circuit has a metastable state in which the frequency phase signal is zero, and when the loss-of-synchronization error occurs, the CDR circuit may be in the metastable state.

Related techniques are disclosed in, for example, Japanese Laid-open Patent Publication Nos. 11-355111 (hereinafter referred to as Patent Literature 1), 2010-141594, 6-216765, and 2002-135093.

In addition, the related techniques are discussed in Ansgar Pottbacker, et al., "A Si Bipolar Phase and Frequency Detector IC for Clock Extraction up to 8 Gb/s", IEEE Journal of Solid-State Circuits, Vol. 27, No. 12, December 1992 (hereinafter referred to as Non-Patent Literature 1).

Desired is a signal reproduction (CDR) circuit that is synchronization-error free and does not lose synchronization even in a lock state and even during reception of a signal having large jitter.

SUMMARY

According to an aspect of the invention, a signal reproduction circuit includes: an oscillator generating first clock and second clock having a same frequency but different phases; and a feedback circuit to control the oscillator in accordance with a phase relation and a frequency relation between input data and the first clock, wherein the feedback circuit includes: a frequency-phase detection circuit to compare a clock phase control signal and a clock phase detection signal and generate a frequency phase signal indicating the frequency relation between the input data and the first clock, a state detection circuit to detect a lock state in which falling edges or rising edges of the input data and the first clock synchronize and a frequency difference state in which frequencies of the input data and the first clock are different, and a selector to supply the frequency phase signal to the feedback loop only in the frequency difference state.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 6A and 6B are time charts of the operations of the CDR circuit performed when jitter of input data is small and when the jitter of the input data is large, FIG. 6A depicting a normal operation in which the jitter is small and FIG. 6B depicting an operation in which an error occurs and the jitter is large;

FIGS. 7A and 7B are time charts depicting, over a plurality of UIs, the operations of the CDR circuit performed when jitter of input data is small and when the jitter of the input data is large, FIG. 7A depicting a normal operation in which the jitter is small and FIG. 7B depicting an operation in which an error occurs and the jitter is large;

FIGS. 8A and 8B are time charts depicting, over a plurality of UIs, the operations of the CDR circuit performed when a falling or rising edge of the first clock synchronizes with a change edge of the input data, FIG. 8A depicting the operation performed when the falling edge synchronizes with the change edge and FIG. 8B depicting the operation performed when the rising edge synchronizes with the change edge;

FIGS. 13A and 13B are time charts depicting signal changes of the sections in the CDR circuit in the first embodiment, FIG. 13A depicting a normal lock state and FIG. 13B depicting an anti-phase lock state;

DESCRIPTION OF EMBODIMENTS

A typical lock data recovery (CDR) circuit is described before describing embodiments.

Figure 1A:
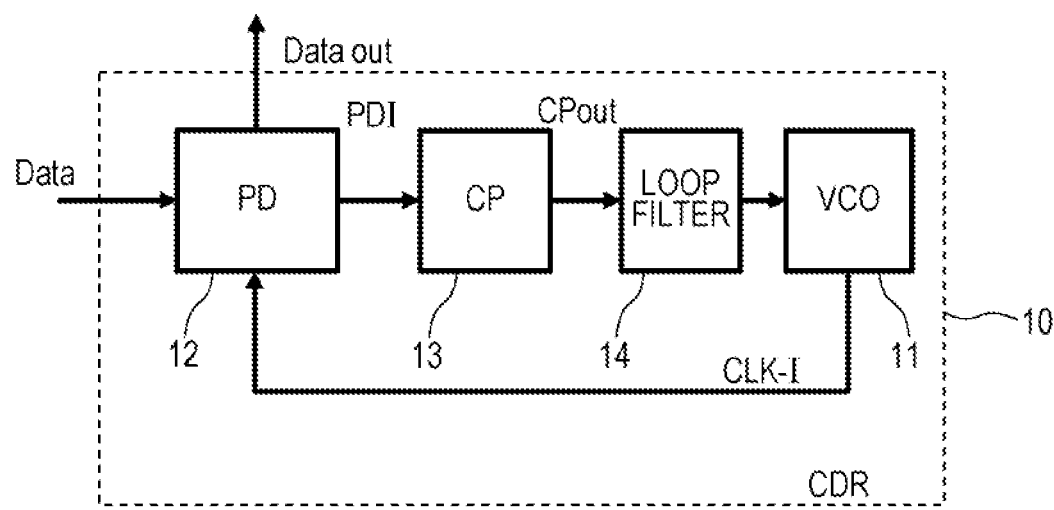
FIG. 1A is a block diagram depicting a CDR circuit utilizing a phase detection circuit that detects a phase difference between input data and a clock.
Figure 1B:
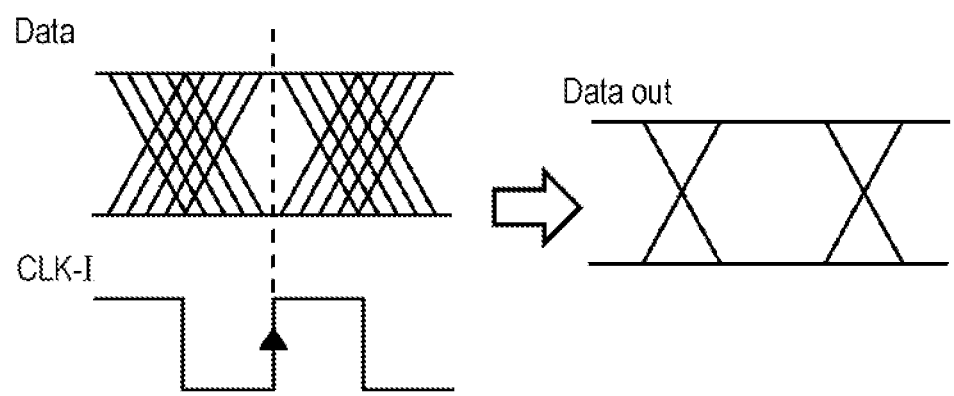
FIG. 1B depicts a relation among the input data, the clock, and output data.

FIG. 1A is a block diagram depicting a CDR circuit utilizing a phase detection circuit (a phase detector (PD)) that detects a phase difference between input data and a clock. FIG. 1B depicts a relation among the input data, the clock, and output data.

As depicted in FIG. 1A, a CDR circuit 10 includes a voltage control oscillator (VCO) 11, a phase detection circuit (a phase detector (PD)) 12, a charge pump (CP) 13, and a loop filter 14. The VCO 11 is not limited to an oscillator based on voltage control as long as a frequency is variable. However, since VCOs are widely used, an example is described in which a VCO described below is used. The VCO 11 generates a clock CLK-I and changes a control voltage, whereby the frequency of the clock CLK-I changes. The PD 12 detects a phase difference signal (a clock phase control signal) PDI between input data Data and the clock CLK-I. As described below, the PD 12 has a function of a latch circuit. The PD 12 detects the phase difference signal PDI, captures the input data Data in synchronization with a change edge of the clock CLK-I, and outputs the input data Data as reception data Data out. The CP 13 performs addition/subtraction of electric currents with respect to the loop filter 14 in accordance with the phase difference signal PDI. The loop filter 14 generates a control voltage corresponding to the phase difference signal PDI. In other words, the CP 13 and the loop filter 14 form a controller of the VCO 11. The VCO 11 changes an oscillation frequency in accordance with the control voltage.

A feedback circuit that changes the oscillation frequency (the frequency of the clock CLK-I) of the VCO 11 is formed by the configuration described above. The feedback circuit performs control such that the frequencies of the input data Data and the clock CLK-I coincide with each other and a change edge (a falling edge) of the clock CLK-I coincides with a change edge of the input data Data, that is, phases of the clock CLK-I and the input data Data coincide with each other.

In a state in which the frequencies and the phases of the input data Data and the clock CLK-I coincide with each other, a rising edge of the clock CLK-I coincides with a state in which the input data Data is in an intermediate phase of a change edge, that is, the input data Data is stable. Therefore, the input data Data is captured in synchronization with the rising edge of the clock CLK-I and correct reception data Data out is outputted.

As depicted in FIG. 1B, even in the state in which the frequencies and the phases of the input data Data and the clock CLK-I coincide with each other, the input data Data has jitter, the phase of which fluctuates with respect to the clock CLK-I, because of the influence of a signal route of the input data Data. Even in a state in which the jitter is present, the rising edge of the clock CLK-I coincides with the state in which the input data Data is in the intermediate phase of the change edge and the phase is stable. Therefore, it is possible to capture the correct reception data Data out and output the reception data Data out having a stable phase.

Figure 2A:
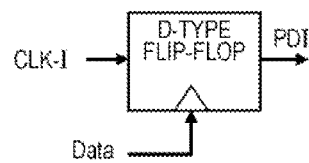
FIG. 2A depicts a circuit example of a phase detector (PD)
Figure 2B:
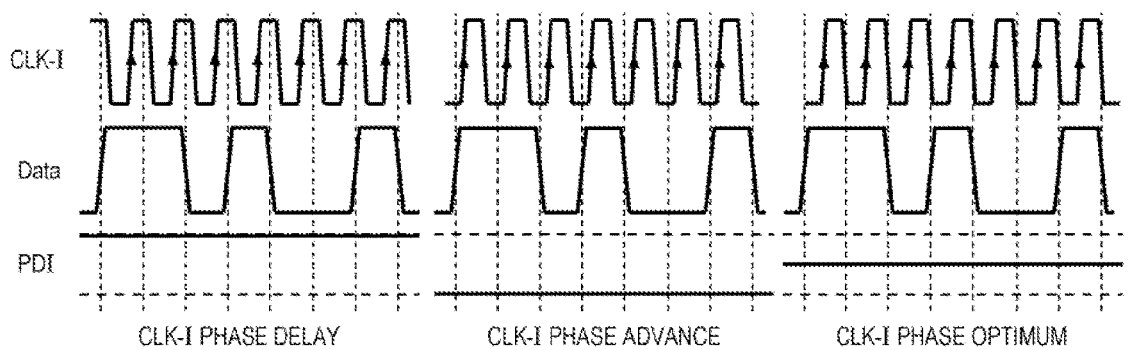
FIG. 2B is a time chart depicting an operation in the CDR circuit.

FIG. 2A depicts a circuit example of a phase detection circuit (a phase detector (PD)). FIG. 2B is a time chart depicting an operation in the CDR circuit.

As depicted in FIG. 2A, the phase detection circuit (PD) is formed by a D-type flip-flop (FF). The input data Data is inputted to a clock terminal of the D-FF and the clock CLK-I is inputted to a data terminal of the D-FF. The D-FF latches a value of the clock CLK-I during a change of the input data Data and outputs the value as the phase difference signal PDI. An example is depicted in which the input data Data is inputted to the clock terminal of the D-FF and the clock CLK-I is inputted to the data terminal of the D-FF. However, a configuration is also possible in which the clock CLK-I is inputted to the clock terminal of the D-FF and the input data Data is inputted to the data terminal of the D-FF. Further, the input data Data and the clock CLK-I are depicted as single-phase signals. However, a high-speed signal equal to or higher than several gigahertz is desirably realized by a differential circuit. Therefore, the D-FF depicted in FIG. 2A latches the clock CLK-I not only at the rising edge of the input data Data but also at the falling edge of the input data Data. The same applies to the following explanation and other signals. However, the embodiment is not limited to this. The D-FF is operable with a single-phase signal. In the case of a differential signal, changes at both of the rising edge and the falling edge are detected by inputting the inverted input data Data and clock CLK-I using two latch circuits.

In the time chart of FIG. 2B, phase delay of the CLK-I with respect to the Data is depicted on the left side, phase advance of the CLK-I with respect to the Data is depicted in the center, and an optimum phase (phase coincidence) of the CLK-I is depicted on the right side.

When the CLK-I is in phase delay with respect to the Data, at a change edge of the Data, the CLK-I is at a high (H) level and the phase difference signal PDI is at the H level. Accordingly, the VCO 11 is controlled to increase an oscillation frequency.

When the CLK-I is in phase advance with respect to the Data, at the change edge of the Data, the CLK-I is at a low (L) level and the phase difference signal PDI is at the L level. Accordingly, the VCO 11 is controlled to reduce the oscillation frequency.

When the phase of the CLK-I with respect to the Data is optimum, at the change edge of the Data, the CLK-I is determined as L or H. However, thereafter, the VCO 11 is controlled such that the opposite determination is obtained. Since such control is repeated, probabilities of the determinations of L and H are equalized. Consequently, the PDI changes between L and H. A control voltage outputted by the loop filter 14 has to an intermediate level between L and H. In FIG. 2B, for convenience of explanation, the PDI is indicated by the intermediate level averaged by the loop filter 14 rather than by a waveform that alternately changes to L and H.

In the CDR circuit depicted in FIG. 1A, a frequency range in which clock reproduction is possible is narrow. Therefore, a CDR circuit utilizing a phase-frequency detection (PFD) circuit that detects a frequency relation between input data and a clock in addition to a phase difference between the input data and the clock is used.

Figure 3A:
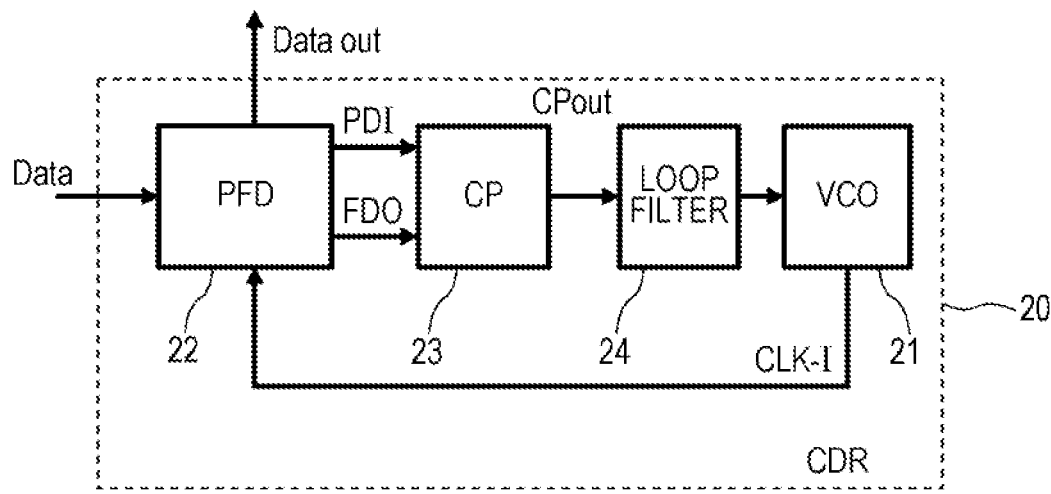
FIG. 3A is a block diagram depicting a CDR circuit utilizing a PFD circuit.
Figure 3B:
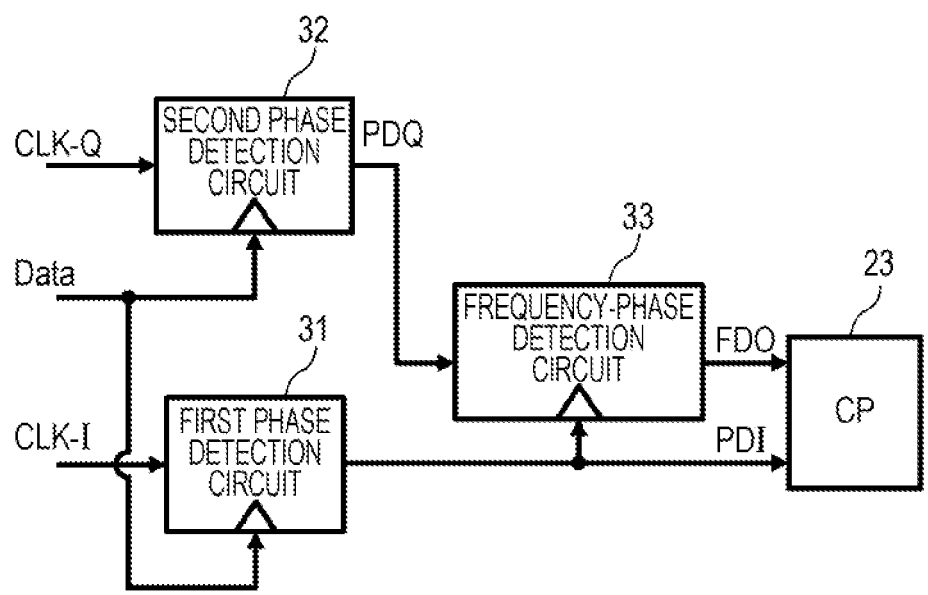
FIG. 3B is a block diagram depicting the configuration of the PFD circuit.

FIG. 3A is a block diagram depicting the CDR circuit utilizing the PFD circuit. FIG. 3B is a block diagram depicting the configuration of the PFD circuit.

As depicted in FIG. 3A, a CDR circuit 20 includes a VCO 21, a phase-frequency detection (PFD) circuit 22, a CP 23, and a loop filter 24. The VCO 21 outputs, in addition to the first clock CLK-I, a second clock CLK-Q having a frequency that is the same as the frequency of the CLK-I and having a phase different from the phase of the CLK-I. For example, the CLK-Q is in phase advance by 90 degrees with respect to the CLK-I. The PFD 22 detects a phase difference PDI between the input data Data and the clock CLK-I and frequency information FDO of the input data Data and the clock CLK-I.

As depicted in FIG. 3B, the PFD 22 includes a first phase detection circuit 31, a second phase detection circuit 32, and a frequency-phase detection circuit 33. As the first phase detection circuit 31, the second phase detection circuit 32, and the frequency-phase detection circuit 33, for example, a first phase detection circuit, a second phase detection circuit, and a frequency-phase detection circuit discussed in Non-Patent Literature 1 may be used. Non-Patent Literature 1 discusses a first phase detection circuit and a second phase detection circuit of a differential type formed by two sample hold circuits (latch circuits) and a multiplexer. Non-Patent Literature 1 discusses a frequency-phase detection circuit of the differential type formed by two latch circuits and a modified multiplexer.

The first phase detection circuit 31 outputs, as the clock phase control signal PDI, a value of the first clock CLK-I latched at the change edge of the input data Data. The clock phase control signal PDI indicates whether the change edge of the CLK-I is in advance or delay with respect to the change edge of the Data. The second phase detection circuit 32 outputs, as the clock phase detection signal PDQ, a value of the second clock CLK-Q latched at the change edge of the Data. The clock phase detection signal PDQ indicates whether the change edge of the CLK-Q is in advance or delay with respect to the change edge of the Data. Note that the PDI signal and the PDQ signal are only different in a phase of a sampled clock. Generation circuits of the PDI signal and the PDQ signal are substantially the same. However, the PDQ signal is referred to as "clock phase detection signal" because the PDQ signal is used for generation of an FDO signal. The PDI signal is referred to as "clock phase control signal" because the PDI signal is used for phase control.

The frequency-phase detection circuit 33 generates, based on the direction of the change edge of the PDI and the value of the PDQ latched at the change edge of the PDI, a frequency phase signal FDO indicating whether the frequency of the CLK-I is small or large with respect to the frequency of the Data. The FDO indicates +1 when the frequency of the CLK-I is small with respect to the frequency of the Data, indicates −1 when the frequency of the CLK-I is large with respect to the frequency of the Data, and indicates 0 when the frequency of the CLK-I is the same as the frequency of the Data. The clock phase control signal PDI and the frequency phase signal FDO are supplied to the charge pump 23. Consequently, the VCO 21 is controlled based on the clock phase control signal PDI and the frequency phase signal FDO.

Figure 4A:
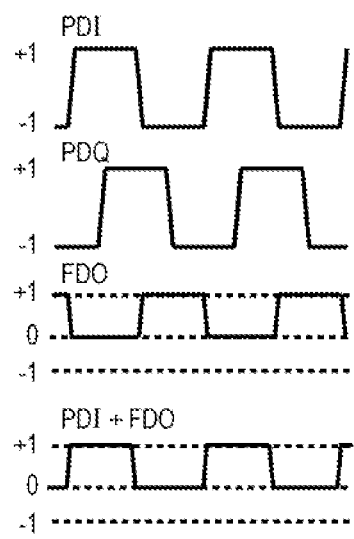
FIGS. 4A and 4B are time charts depicting the operations of sections of the PFD depicted in FIG. 3B, FIG. 4A depicting a waveform of a state in which the frequency of input data and the frequency of a first clock are different from each other and FIG. 4B depicting a waveform of a normal lock state in which frequencies and phases coincide with each other.
Figure 4B:
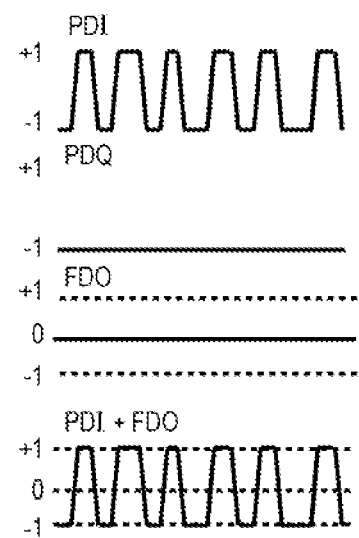

FIGS. 4A and 4B are time charts depicting the operations of sections of the PFD depicted in FIG. 3B. FIG. 4A depicts a waveform of a state in which the frequency of the input data Data and the frequency of the first clock CLK-I are different and FIG. 4B depicts a waveform of a normal lock state in which those frequencies and phases coincide with each other.

As depicted in FIG. 4A, in a state in which the frequencies of the Data and the CLK-I are different, both of the clock phase control signal PDI and the clock phase detection signal PDQ change and the frequency phase signal FDO also changes. FIG. 4A is a state in which the frequency of the CLK-I is smaller than the frequency of the Data. As depicted in FIG. 4A, the FDO changes between 0 and +1 in anti-phase with the PDI. In a state in which the frequency of the CLK-I is larger than the frequency of the Data, the FDO changes between 0 and −1. When PDI+FDO obtained by combining the PDI and the FDO at 1:1 is generated as a control signal by the charge pump 23 and the loop filter 24, the PDI+FDO changes between 0 and +1 and increases the oscillation frequency of the VCO 21. Note that the control signal is not limited to the PDI+FDO. Weighting of the combination may be varied in some cases.

As depicted in FIG. 4B, when the frequencies and the phases of the Data and the CLK-I coincide with each other, the clock phase control signal PDI changes but the clock phase detection signal PDQ is fixed to a predetermined value (−1). Accordingly, the frequency phase signal FDO becomes zero. Therefore, the PDI+FDO is the PDI. the VCO 21 is controlled using only the clock phase control signal PDI without using the frequency phase signal FDO.

Patent Literature 1 proposes to provide the selector that switches a signal supplied to the charge pump without using the combined signal of the clock phase control signal PDI and the clock phase detection signal PDQ as described above.

Figure 5:
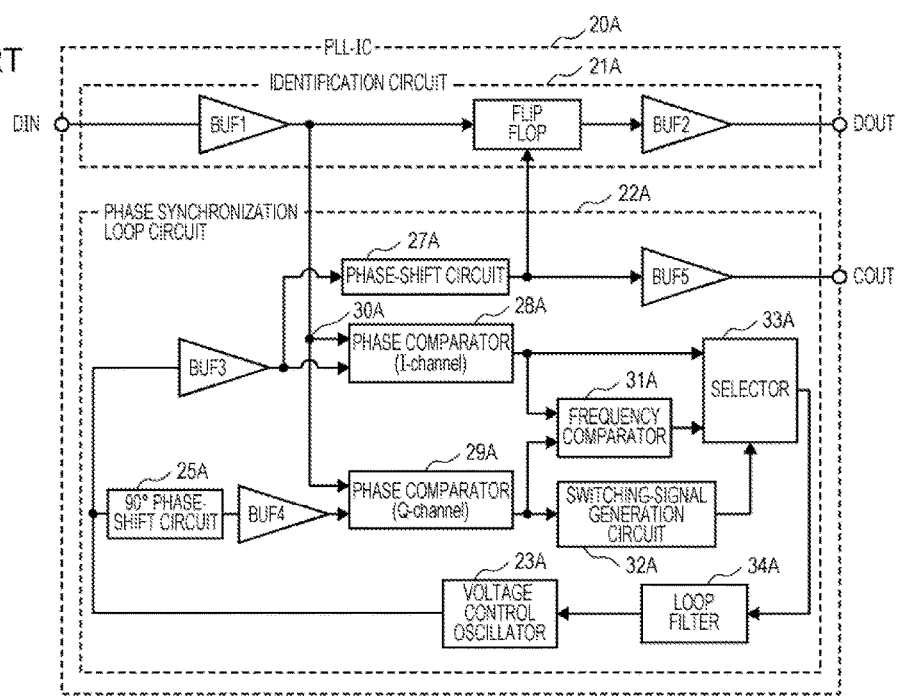
FIG. 5 is a block diagram of a PLL-IC including a CDR (a phase synchronization loop circuit) depicted in FIG. 8 of Patent Literature 1.

FIG. 5 is a block diagram of a PLL-IC including a CDR (a phase synchronization loop circuit) depicted in FIG. 8 of Patent Literature 1. A phase comparator (I-channel) 28A, a phase comparator (Q-channel) 29A, and a frequency comparator 31A correspond to the first phase detection circuit 31, the second phase detection circuit 32, and the frequency-phase detection circuit 33 depicted in FIG. 3B. As depicted in FIG. 5, a selector 33A that selects an output of the phase comparator 28A and an output of the frequency comparator 31A is provided. The switching signal generation circuit 32A detects, from an output of the, phase comparator 29A whether the frequencies of the Data and the CLK-I coincide with each other and outputs a switching signal for the selector 33A. The selector 33A selects the output of the frequency comparator 31A when the frequencies of the Data and the CLK-I do not coincide with each other and selects the output of the phase comparator 28A when the frequencies of the Data and the CLK-I coincide with each other. Consequently, the output of the frequency comparator 31A (FDO in FIGS. 3A and 3B) is supplied to the loop filter 34A when the frequencies of the Data and the CLK-I are different. The output of the phase comparator 28A (PDI in FIGS. 3A and 3B) is supplied to the loop filter 34A when the frequencies of the input data and the clock coincide with each other.

The PDI+FDO in FIGS. 3A and 3B and the control of the VCO by the signal switched by the selector in FIG. 5 are substantially similar. Therefore, in the following explanation, the PDI+FDO in FIGS. 3A and 3B is used to describe the control.

In a state in which the frequencies and the phases of the Data and the CLK-I coincide with each other as described above, the FDO becomes zero and the VCO 21 is controlled substantially based only on the clock phase control signal PDI. However, even if the frequencies of the Data and the CLK-I coincide with each other, when jitter of the received input data Data is large because of the influence of a communication route or the like, the frequency phase signal FDO may affect the control of the VCO 21. When a situation in which the frequency phase signal FDO does not affect the control of the VCO 21 changes to a situation in which the frequency phase signal FDO affects the control of the VCO 21, the control greatly fluctuates and deviates from the lock state. It sometimes takes long to return to the lock state.

FIGS. 6A and 6B are time charts of the operations of the CDR circuit performed when jitter of the input data Data is small and when the jitter of the input data Data is large. FIG. 6A depicts a normal operation in which the jitter is small and FIG. 6B depicts an operation in which jitter is large and an error occurs.

As depicted in FIG. 6A, during the normal lock, the falling edge of the CLK-I synchronizes with the change edge of the Data. The PDI changes to High (+1) or Low (−1) in synchronization with the change edge of the Data. It may occur that the PDI does not change in synchronization with the change edge of the Data. However, a state in which the PDI does not change does not continue. In FIGS. 6A and 6B, to indicate the change to H or L, the PDI is depicted as frequently changing. However, actually, the PDI changes once at most with respect to the change edge of the Data.

The second clock CLK-Q is a signal having a frequency that is the same as the frequency of the first clock CLK-I and in phase advance by 90 degrees. The change edge of the Data synchronizes with the falling edge of the CLK-I during the normal lock. Therefore, the CLK-Q is L at the change edge of the Data. Therefore, since the clock phase detection signal PDQ is L, the frequency phase signal FDO is zero (0). Therefore, the PDI+FDO is substantially the PDI. The VCO 21 is controlled only in accordance with the clock phase control signal PDI.

As depicted in FIG. 6B, when the jitter of the input data Data is large, the change edge of the Data fluctuates with respect to the falling edge of the CLK-I. If the fluctuation is smaller than a range of ±90 degrees (±0.25 UI) at most, the PDQ maintains the state of L. However, when the fluctuation exceeds ±90 degrees, the PDQ may change to L and thereafter change to H. UI is one cycle (unit interval) of the input data Data and the clock. In FIG. 6B, to indicate the change to H or L, the PDQ is depicted as frequently changing. However, actually, the PDQ changes once at most with respect to the change edge of the Data.

When the PDQ changes, the frequency phase signal FDO changes to increase (UP) or decrease (DOWN). The change is opposite to the change of the PDI. The PDI+FDO may become zero. The PDI+FDO may intermittently become zero. Therefore, there is a period in which the PDI+FDO intermittently becomes zero during the change of the PDI. When the PDI+FDO becomes zero, phase adjustment is not performed in a state in which phase adjustment corresponding to the PDI has to be performed. Therefore, the control is stopped in an abnormal phase and an error occurs.

FIGS. 7A and 7B are time charts depicting, over a plurality of UIs, the operations of the CDR circuit performed when jitter of the input data Data is small and when the jitter of the input data Data is large. FIG. 7A depicts a normal operation in which the jitter is small and FIG. 7B depicts an operation in which the jitter is large and an error occurs. In FIGS. 7A and 7B, a crossed-line region of the input data Data indicates a range of the jitter of the Data.

As depicted in FIG. 7A, during a normal operation when the jitter is small, the falling edge of the first clock CLK-I synchronizes with the change edge of the input data Data. The clock phase control signal PDI changes to H or L in synchronization with the change edge of the Data. The clock phase detection signal PDQ is L and the frequency phase signal FDO is zero. Therefore, the PDI+FDO is substantially the PDI. The VCO 21 is controlled only in accordance with the clock phase control signal PDI.

As depicted in FIG. 7B, when the jitter is large, the clock phase control signal PDI changes as in FIG. 7A. However, the clock phase detection signal PDQ is not fixed to the state of L. The clock phase detection signal PDQ is sometimes H as in a portion indicated by X. Therefore, the FDO is −1 or +1, that is, a value other than zero in a portion indicated by Y. Therefore, the PDI+FDO is zero in a portion indicated by Z. Consequently, in the portion indicated by Z, a control signal for causing the CLK-I to follow the change edge of the Data is not applied to the VCO 21, the control stops in an abnormal phase, and an error occurs.

As described above, the CDR circuit depicted in FIGS. 3A and 3B do not receive the input data Data having the jitter, the fluctuation by which exceeds ±90 degrees, that is, 0.5 UI (unit interval).

Further, when the jitter of the Data is large and the frequency-phase detection circuit 33 outputs a wrong FDO, the PDI+FDO becomes zero and the CDR circuit is unlocked. Therefore, the CDR circuit may be locked in an anti-phase metastable state in which the rising edge of the CLK-I synchronizes with the change edge of the Data.

FIGS. 8A and 8B are time charts depicting, over a plurality of UIs, the operations of the CDR circuit when the falling or rising edge of the first clock CLK-I synchronizes with the change edge of the input data Data. FIG. 8A depicts the operation performed when the falling edge of the first clock CLK-I synchronizes with the change edge of the input data Data and FIG. 8B depicting the operation performed when the rising edge of the first clock CLK-I synchronizes with the change edge.

FIG. 8A is a time chart same as the time chart of FIG. 7A. Explanation of FIG. 8A is therefore omitted.

As depicted in FIG. 8B, when the rising edge of the CLK-I synchronizes with the change edge of the Data, the PDI changes between H and L. However, the PDQ is fixed to the state of H rather than L. Therefore, the FDO changes in anti-phase with the PDI, the PDI+FDO becomes zero, and the feedback control of the VCO 21 is locked in the anti-phase metastable state. In the metastable state, a phase difference between the rising edge of the CLK-I and the change edge of the Data gradually changes to one side, the PDQ changes to L, and the CDR circuit is unlocked from the metastable state. The feedback control is performed to set the CDR circuit in the normal lock state again. However, it takes long before the CDR circuit returns to the normal lock state.

In the embodiments described below, realized is a signal reproduction (CDR) circuit that is synchronization-error free and does not lose synchronization in a lock state even during reception of a signal having large jitter and is not locked in the anti-phase metastable state.

Figure 9:
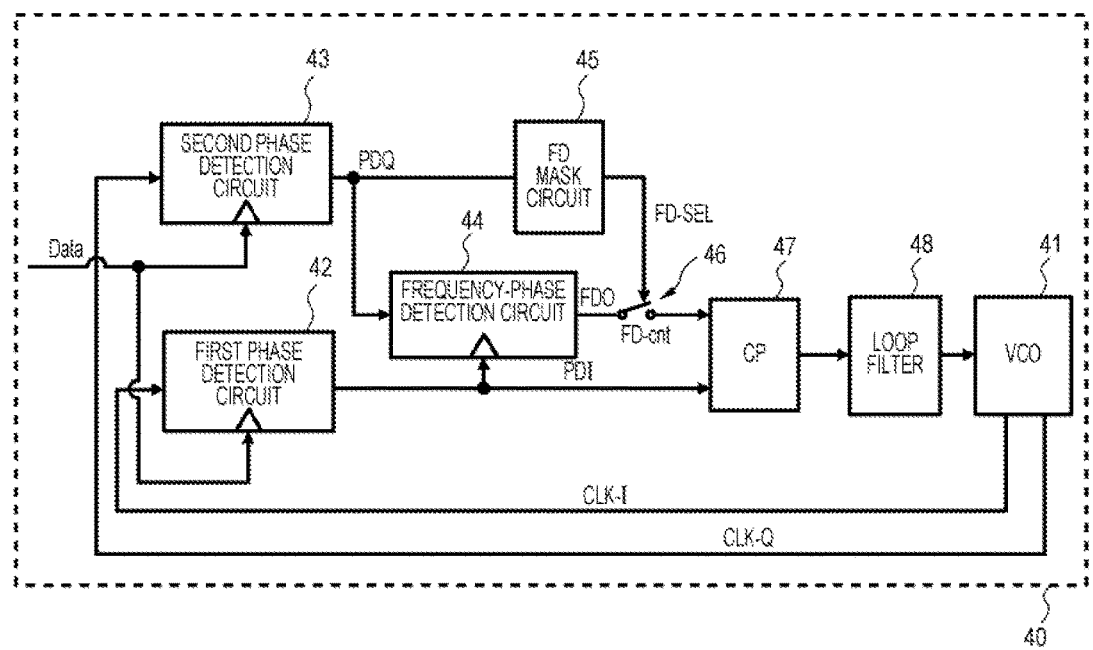
FIG. 9 is a block diagram depicting the configuration of a signal reproduction (CDR) circuit in a first embodiment.

FIG. 9 is a block diagram depicting the configuration of a signal reproduction (clock data recovery (CDR)) circuit in a first embodiment.

A CDR circuit 40 in the first embodiment includes a voltage control oscillator (VCO) 41, a first phase detection circuit 42, a second phase detection circuit 43, a frequency-phase detection circuit 44, an FD mask circuit 45, a selector 46, a charge pump (CP) 47, and a loop filter 48. Components same as the corresponding components depicted in FIGS. 3A and 3B may be used as the VCO 41, the first phase detection circuit 42, the second phase detection circuit 43, the frequency-phase detection circuit 44, the CP 47, and the loop filter 48. However, the VCO 41, the first phase detection circuit 42, the second phase detection circuit 43, the frequency-phase detection circuit 44, the CP 47, and the loop filter 48 are not limited to those components.

The VCO 41 generates the first clock CLK-I and the second clock CLK-Q having a frequency that is the same as the frequency of the first clock CLK-I and having a phase different from the phase of the CLK-I. The VCO 41 changes a control voltage to thereby change the frequencies of the CLK-I and the CLK-Q. The CLK-Q is in phase advance by 90 degrees with respect to the CLK-I.

The first phase detection circuit 42 outputs a value of the first clock CLK-I latched at the change edge of the input data Data as the clock phase control signal PDI. The clock phase control signal PDI indicates whether the change edge of the CLK-I is in advance or delay with respect to the change edge of the Data. The second phase detection circuit 43 outputs a value of the second clock CLK-Q latched at the change edge of the Data as the clock phase detection signal PDQ. The clock signal detection signal PDQ indicates whether the change edge of the CLK-Q is in advance or delay with respect to the change edge of the Data. The frequency-phase detection circuit 44 generates, based on the direction of the change edge of the PDI and the value of the PDQ latched at the change edge of the PDI, the frequency phase signal FDO indicating whether the frequency of the CLK-I is small or large with respect to the frequency of the Data. The FDO indicates +1 when the frequency of the CLK-I is small with respect to the frequency of the Data, indicates −1 when the frequency of the CLK-I is large with respect to the frequency of the Data, and indicates 0 when the frequency of the CLK-I is the same as the frequency of the Data. The first phase detection circuit 42, the second phase detection circuit 43, and the frequency-phase detection circuit 44 are realized by, for example, the differential type circuit discussed in Non-Patent Literature 1.

The FD mask circuit 45 detects, using the clock phase detection signal PDQ, in which of a normal lock state, an anti-phase lock state, and a frequency difference state the CDR circuit 40 is. The normal lock state is a state in which the frequencies of the input data Data and the first clock CLK-I coincide with each other and the falling edge of the CLK-I synchronizes with the change edge of the Data. The anti-phase lock state is a state in which the frequencies of the Data and the CLK-I coincide with each other and the rising edge of the CLK-I synchronizes with the change edge of the Data. The frequency difference state is a state in which the frequencies of the Data and the CLK-I are different. Since the FD mask circuit 45 detects such a state, the FD mask circuit 45 is referred to as state detection circuit as well. The FD mask circuit 45 outputs, to the selector 46, a selection signal FD-SEL for instructing shut-off in the normal lock state and the anti-phase lock state and instructing connection in the frequency difference state.

The selector 46 switches, in accordance with the selection signal FD-SEL outputted from the FD mask circuit 45, between supplying and non-supplying of the frequency phase signal FDO outputted from the frequency-phase detection circuit 44 to the CP 47. Specifically, the selector 46 switches between supplying the FDO to the CP 47 in the frequency difference state and not supplying the FDO to the CP 47 in the normal lock state and the anti-phase lock state. A signal supplied from the selector 46 to the CP 47 is represented by FD-cnt. Therefore, the FD-cnt is the FDO in the frequency difference state and is a fixed value (e.g., 0) not affecting the CP 47 in the normal lock state and the anti-phase lock state.

The CP 47 performs addition/subtraction of electric currents to the loop filter 48 in accordance with the PDI and the FDO in the frequency difference state and performs addition/subtraction of electric currents to the loop filter 48 in accordance with the PDI in the normal lock state and the anti-phase lock state. The loop filter 48 generates a control voltage based on the addition/subtraction of electric currents and supplies the control voltage to the VCO 41.

With the configuration described above, a feedback control system is formed in which the frequency of the first clock CLK-I coincides with the frequency of the input data Data and the falling edge of the CLK-I synchronizes with the change edge of the Data. That is, the first phase detection circuit 42, the second phase detection circuit 43, the frequency-phase detection circuit 44, the FD mask circuit 45, the selector 46, the CP 47, and the loop filter 48 configure a feedback control circuit that controls the VCO 41. Further, the first phase detection circuit 42, the second phase detection circuit 43, and the frequency-phase detection circuit 44 configure a phase-frequency detector (PFD) that detects a phase relation and a frequency relation of the Data and the CLK-I.

Figure 10:
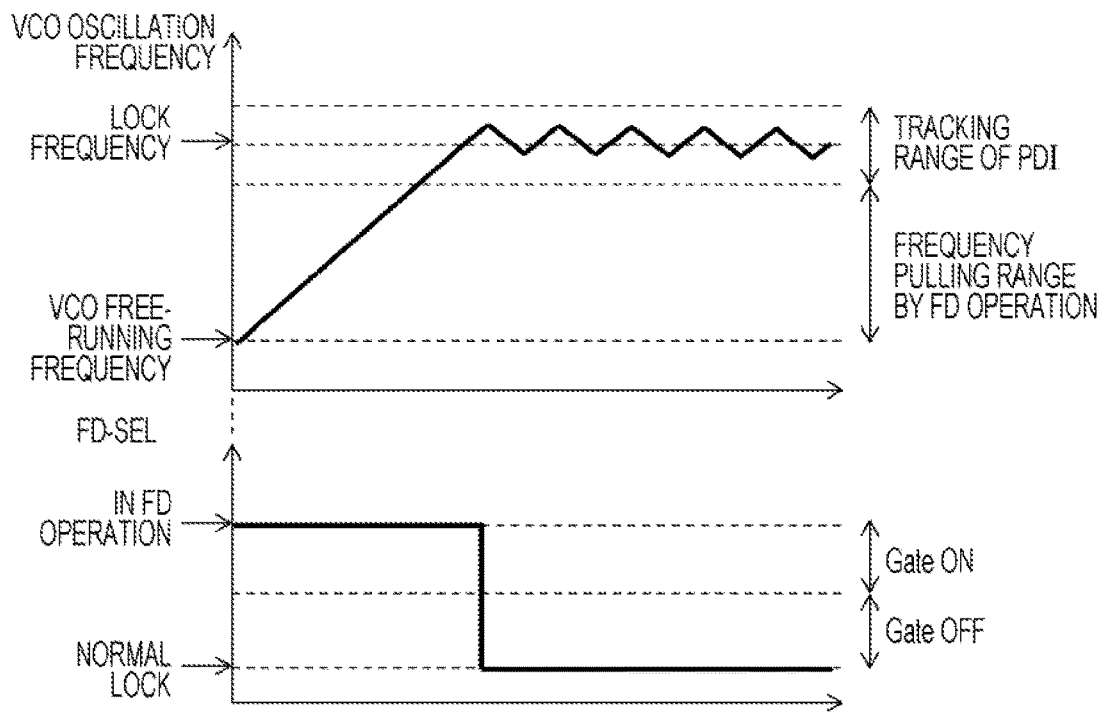
FIG. 10 is a diagram depicting the operation during the start of the CDR circuit in the first embodiment.

FIG. 10 is a diagram depicting an operation during the start of the CDR circuit 40 in the first embodiment.

In FIG. 10, a change in an oscillation frequency of the VCO 41 (the frequency of the CLK-I) is depicted on the upper side and a change in the FD-SEL is depicted on the lower side.

When the CDR circuit 40 is started, the oscillation frequency of the VCO 41 monotonously increases from a self-running frequency with the feedback control. During the increase in the oscillation frequency, the FD-SEL indicates a gate ON in which the FDO is supplied as the FD-cnt. When the oscillation frequency of the VCO 41 increases to a predetermined range (a tracking range of the PDI) before and after a lock frequency, which is the frequency of the Data, and the FD mask circuit 45 detects the increase, the FD-SEL changes to a value indicating normal lock. During the normal lock, the FD-SEL changes to gate OFF in which the FDO is not supplied as the FD-cnt. Consequently, a control voltage of the VCO 41 is controlled by only the PDI. A range of the oscillation frequency of the VCO 41 changing from the self-running frequency to the tracking range of the PDI is a frequency pulling range by a frequency difference operation. By using the PFD, it is possible to increase the frequency pulling range compared with when the PD is used. In the normal lock state, the oscillation frequency of the VCO 41 repeats an increase and a decrease to coincide with the lock frequency by the feedback control.

Figure 11:
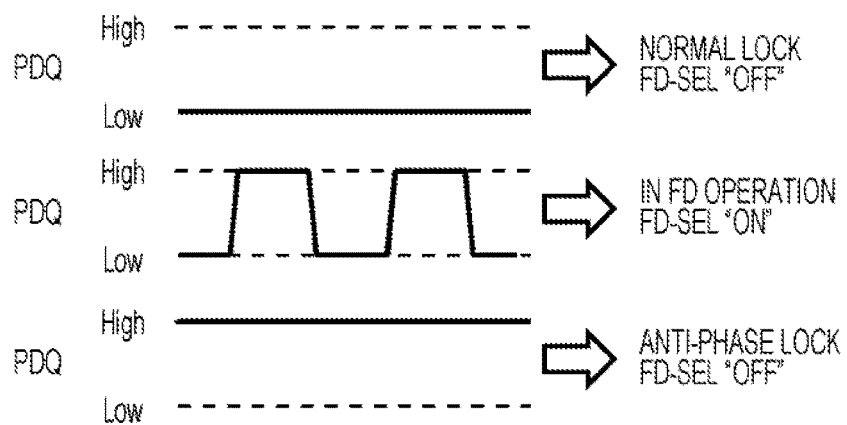
FIG. 11 is a time chart depicting the operation of the CDR circuit in the first embodiment and depicts clock phase detection signals in respective states.

FIG. 11 a time chart depicting the operation of the CDR circuit 40 in the first embodiment and depicts the PDQ in respective states.

As depicted in FIG. 11, the clock phase detection signal PDQ is fixed to L in the normal lock state and alternately changes to H and L in the frequency difference state. In the anti-phase lock state, a state in which the clock phase detection signal PDQ is H lasts long to a certain degree. In this way, the PDQ is a signal indicating the normal lock state, the frequency difference state, and the anti-phase lock state.

In the normal lock state, if the jitter of the Data is large, even when the frequencies of the input data Data and the first clock CLK-I coincide with each other, the CDR circuit depicted in FIGS. 3A and 3B changes to the frequency difference state and is unlocked. Thereafter, the CDR circuit performs an operation for converging to the normal lock state again. To restrain such unlock, during the normal lock state, even if the PDQ temporarily changes to other than L because of the jitter, it is not immediately determined that the CDR circuit is in the frequency difference state and the supply stop to the CP 47 of the FDO is maintained.

Further, since it is detected that the CDR circuit 40 is in the anti-phase lock state according to the PDQ, it is possible to restrain the CDR circuit 40 from being locked in the metastable state by maintaining the supply stop to the CP 47 of the FDO during the anti-phase lock state.

Figure 12:
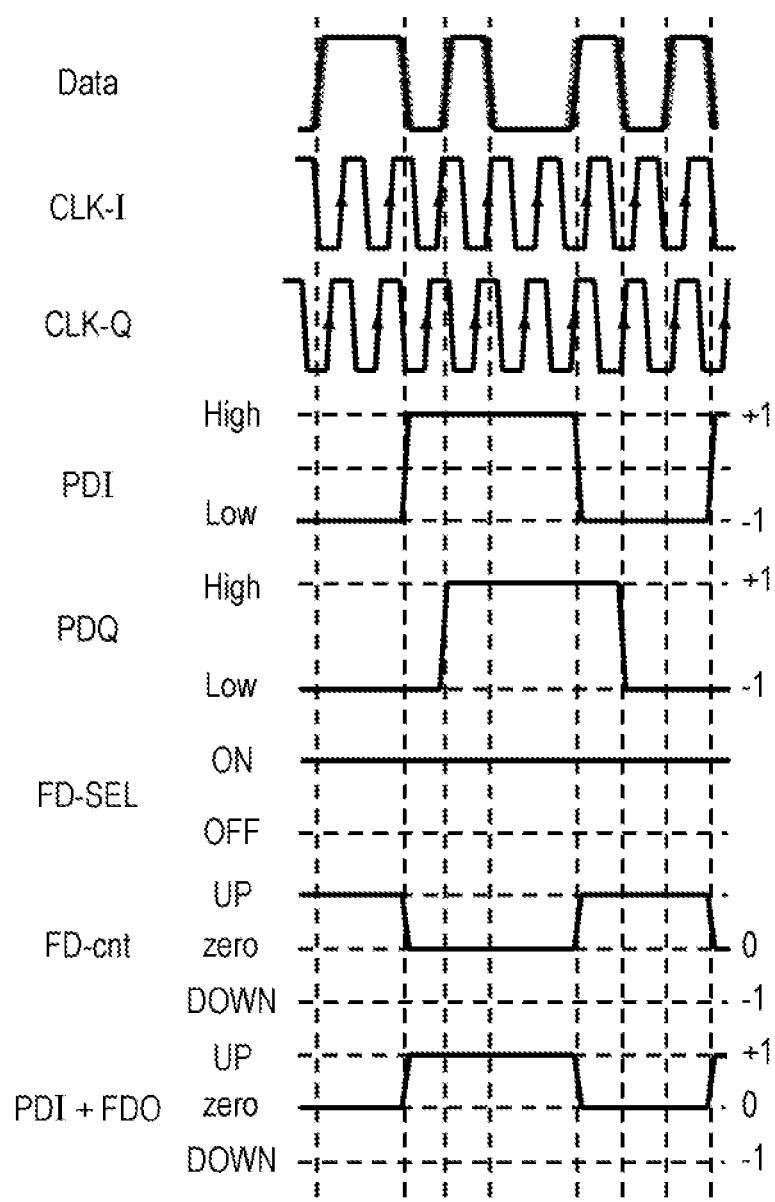
FIG. 12 is a time chart depicting the operation of the CDR circuit in the first embodiment and depicts changes in signals of sections in a frequency difference state.

FIG. 12 is a time chart depicting the operation of the CDR circuit 40 in the first embodiment. FIG. 12 depicts changes of the PDI, the PDQ, the FD-SEL, the PD-cnt, and the PDI+FDO in the frequency difference state.

The frequencies of the CLK-I and the CLK-Q are different from (smaller than) the frequency of the Data. Therefore, a phase relation, that is, the phases of the CLK-I and the CLK-Q at the change edge of the Data gradually change. Therefore, the PDI and the PDQ alternately change to H and L in each of the plurality of UIs as depicted in FIG. 12. Since the PDQ changes, the FD mask circuit 45 determines that the CDR circuit 40 is in the frequency difference state and changes the FD-SEL to ON. Consequently, the selector 46 performs the gate ON and the FDO is supplied to the CP 47 as the FD-cnt. The FDO at this point is a signal having the same waveform depicted as the FD-cnt in FIG. 12 and alternately changes between Up and zero. Therefore, the PDI+FDO supplied to the CP 47 alternately changes between zero and UP as depicted in FIG. 12. The VCO 41 is controlled to increase the oscillation frequency.

FIGS. 13A and 13B are time charts depicting changes in the PDI, the PDQ, the FD-SEL, the PD-cnt, and the PDI+FDO in the CDR circuit 40 in the first embodiment. FIG. 13A depicts the normal lock state and FIG. 13B depicts the anti-phase lock state.

In the normal lock state, as depicted in FIG. 13A, the frequencies of the CLK-I and the CLK-Q are the same as the frequency of the Data. The CDR circuit 40 is feedback-controlled such that the falling edge of the CLK-I follows the change edge of the Data. Therefore, the PDI alternately changes to H and L at every change edge of the Data or every plurality of (two) of the edge changes of the Data. On the other hand, the CLK-Q is normally L at the change edge of the Data and the PDQ is fixed to the L. Therefore, the FD mask circuit 45 determines that the CDR circuit 40 is in the normal lock state and changes the FD-SEL to OFF. Consequently, the selector 46 performs the gate OFF, the FD-cnt becomes zero, and the FDO is not supplied to the CP 47. Therefore, the PDI+FDO supplied to the CP 47 is the same as the PDI. The VCO 41 repeats an increase and a decrease of the oscillation frequency such that the falling edge of the CLK-I follows the change edge of the Data.

In the anti-phase lock state, as depicted in FIG. 13B, the frequencies of the CLK-I and the CLK-Q are the same as the frequency of the Data. The rising edge of the CLK-I synchronizes with the change edge of the Data. Therefore, the PDI alternately changes to H and L at every change edge of the Data or at every plurality of (two) of the edge changes of the Data. On the other hand, the CLK-Q is normally H at the change edge of the Data and the PDQ is fixed to H. Therefore, the FD mask circuit 45 determines that the CDR circuit 40 is in the anti-phase lock state and changes the FD-SEL to OFF. Consequently, the selector 46 performs the gate OFF, the FD-cnt becomes zero, and the FDO is not supplied to the CP 47. Therefore, the PDI+FDO supplied to the CP 47 is the same as the PDI. In the anti-phase lock state, the rising edge of the CLK-I synchronizes with the change edge of the Data. However, in the normal lock state, the falling edge of the CLK-I synchronizes with the change edge of the Data. Therefore, the VCO 41 is controlled to repeat an increase and a decrease of the oscillation frequency and change the phase until the falling edge of the CLK-I follows the change edge of the Data.

Figure 14A:
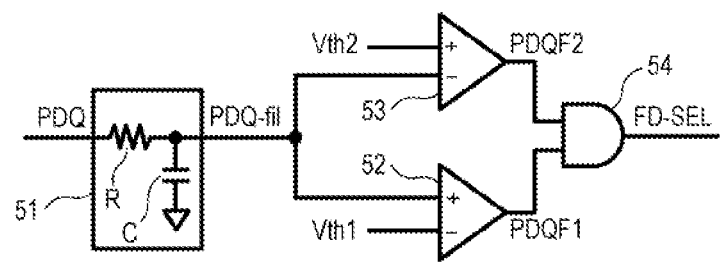
FIGS. 14A to 14D are diagrams depicting the circuit configuration and the operation of an FD mask circuit in the CDR circuit according to the first embodiment, FIG. 14A depicting the circuit configuration and FIGS. 14B to 14D depicting operation waveforms.
Figures 14B, 14C, 14D:
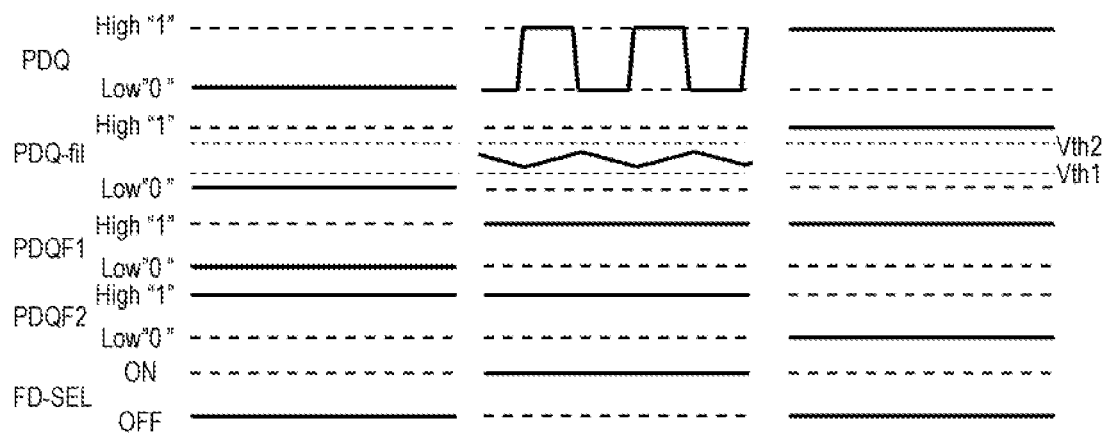

FIGS. 14A to 14D are diagrams depicting the circuit configuration and the operation of the FD mask circuit 45 in the CDR circuit 40 according to the first embodiment. FIG. 14A depicts the circuit configuration and FIGS. 14B to 14D depict operation waveforms.

As depicted in FIG. 14A, the FD mask circuit 45 includes a low-pass filter 51, comparators 52 and 53, and an AND gate 54. The low-pass filter 51 is a known circuit including a resistor R and a capacitance element C. The low-pass filter 51 removes a high-frequency component from an input PDQ and outputs a PDQ-fil. A transmission band of the low-pass filter 51 is desirably set to be equal to or lower than a jitter transmission band of the CDR circuit 40. Consequently, it is possible to restrain occurrence of an unstable state due to jitter of the Data. The comparator 52 compares the PDQ-fil with a first threshold Vth1. If the PDQ-fil is larger than the first threshold Vth1, the comparator 52 outputs H (High) as PDQF1. If the PDQ-fil is smaller than the first threshold Vth1, the comparator outputs L (low) as the PDQF1. The comparator 53 compares the PDQ-fil with the second threshold Vth2. If the PDQ-fil is larger than the second threshold Vth2, the comparator 53 outputs L as PDQF2. If the PDQ-fil is smaller than the second threshold Vth2, the comparator 53 outputs H as the PDQF2. The AND gate 54 calculates an AND of the PDQF1 and the PDQF2 and outputs the AND as the FD-SEL. Therefore, if the PDF-fil obtained by removing the high-frequency component from the PDQ is in a range of a value larger than Vth1 and smaller than Vth2, the FD-SEL is H (ON). If the PDF-fil is outside the range, the FD-SEL is L (OFF).

FIGS. 14B to 14D depict operation waveforms of the sections of the FD mask circuit 45. FIG. 14B depicts the normal lock state, FIG. 14C depicts the frequency difference state, and FIG. 14D depicts the anti-phase lock state. As depicted in FIG. 14B, in the normal lock state, the PDQ is fixed to L (0). Therefore, the PDQ-fil is also L (0), the PDQF1 changes to L (0), the PDQF2 changes to H (1), and the FD-SEL changes to L (OFF). As depicted in FIG. 14C, in the frequency difference, the PDQ alternately changes to H (1) and L (0). Proportions of H and L are substantially equal. Therefore, the PDQ-fil is averaged and repeats a change at small amplitude centering on 0.5, that is, in a range of a value larger than Vth1 and smaller than Vth2. Therefore, the PDQF1 and PDQF2 change to H (1) and the FD-SEL changes to H (ON). As depicted in FIG. 14D, in the anti-phase lock state, the PDQ is fixed to H (1). Therefore, the PDQ-fil is also H (1), the PDQF1 changes to H (1), the PDQF2 changes to L (0), and the FD-SEL changes to L (OFF).

As described above, the FD mask circuit 45 depicted in FIG. 14A outputs FD-SEL=H(ON) during the frequency difference state and outputs FD-SEL=L(OFF) during the normal lock state and the anti-phase lock state other than the frequency difference state.

The charge pump (CP) 47 in the first embodiment may be realized by a charge pump circuit including a known two-input type differential pair. However, an output of the CP 47 desirably does not fluctuate even if input or non-input of the FDO to the CP 47 is switched. Therefore, in the lock state, zero is outputted as the FDO and a portion for FDO input of the differential pair does not change.

Figure 15:
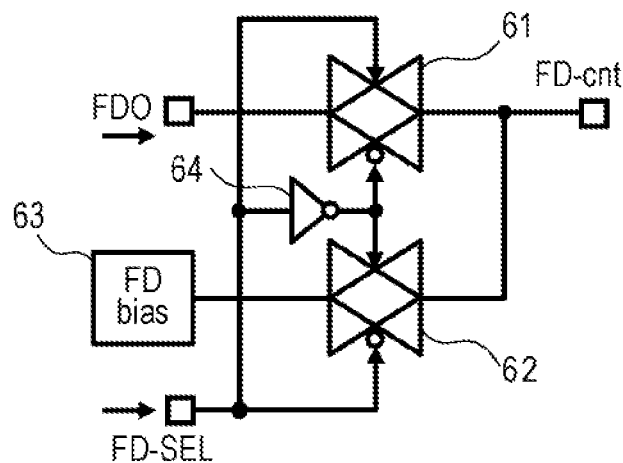
FIG. 15 is a diagram depicting a circuit example of a selector in the first embodiment.

FIG. 15 is a diagram depicting a circuit example of the selector 46 in the first embodiment.

The selector 46 in the first embodiment may be realized by a switch that switches between passage and non-passage of the FDO. However, when the switch is simply shut off, the output FD-cnt of the selector 46 floats. It is sometimes undesirable that the floating output FD-cnt is inputted to the CP 47. Therefore, as depicted in FIG. 15, it is desirable to use a selector circuit that allows the FDO to pass during the FD operation and outputs, during the normal lock and the anti-phase lock, a bias value FD-bias optimum for the CP 47 to operate.

The selector circuit depicted in FIG. 15 includes transfer gates (TGs) 61 and 62, a bias source (FDbias) 63 that outputs the FD-bias, and an inverter 64. When the FD-SEL is ON, the TG 61 changes to a passage state and allows the FDO to pass, the TG 62 changes to a shut-off state, and the FDO is outputted as the FD-cnt. When the FD-SEL is OFF, the TG 61 changes to the shut-off state, the TG 62 changes to the passage state and allows the FD-bias to pass, and the FD-bias is outputted as the FD-cnt.

The selector 46 may also be provided integrally with the CP 47.

Figure 16:
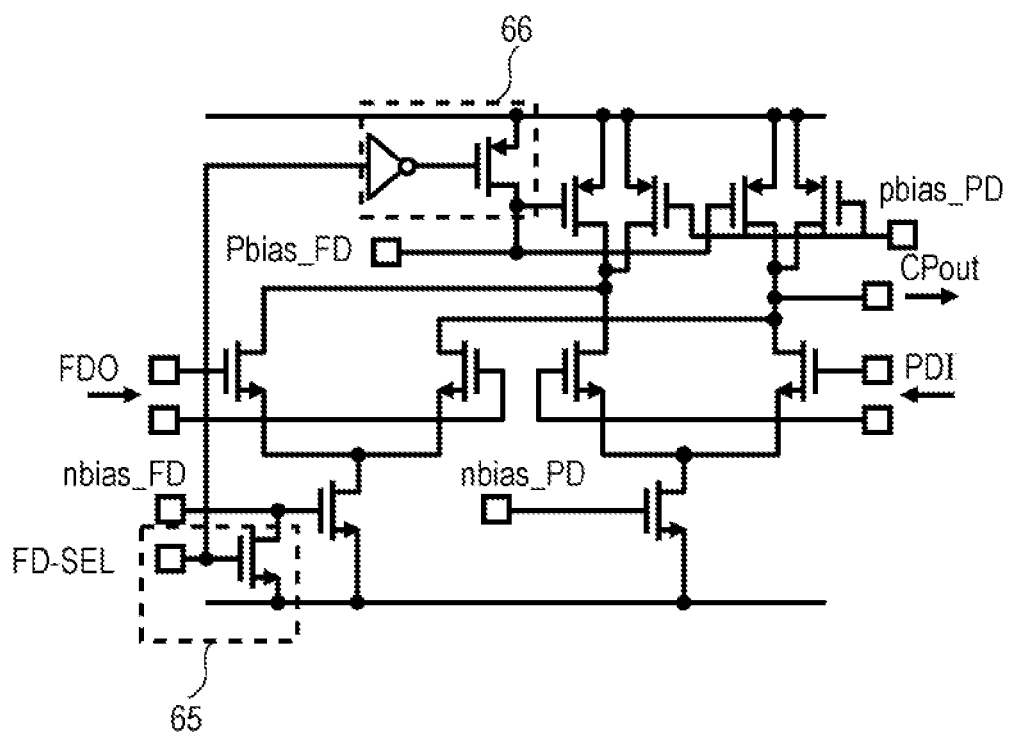
FIG. 16 is a circuit diagram of a modification of the selector and a charge pump (CP) in the first embodiment.

FIG. 16 is a circuit diagram of a modification of the selector 46 and the charge pump (CP) 47 in the first embodiment.

In FIG. 16, in a two-input charge pump (CP), one input is set as an input for PDI input, the other input is set as an input for FDO input, and nbias_PD and nbias_FD are applied to gates of NMOSs forming current sources of the inputs to make it possible to set a contributing current ratio. Loads of the differential pair are formed by two PMOSs and pbias_PD and pbias_FD are applied to gates of the PMOSs to make it possible to change the loads. The CP further includes switch circuits 65 and 66 equivalent to the selector 46. The switch circuit 65 is connected between the gate of the NMOS forming the current source for the FDO input and a low-side reference power supply and includes a switch NMOS, to a gate of which the FD-SEL is applied. The switch NMOS is turned off when the FD-SEL is OFF (L) and is turned on when the FDO input of the differential pair normally operates and the FD-SEL is ON (H) to turn off the current source of the FDO input to make the FDO input of the differential pair not to operate. The switch circuit 66 is connected between the gate of the PMOS for loads, to the gate of which the pbias_FD is applied, and a high-side reference power supply and includes a switch PMOS, to a gate of which the FD-SEL inverted by the inverter is applied. The switch PMOS is turned off when the FD-SEL is OFF (L). The PMOS, to the gate of which the pbias_FD is applied, operates as a load. However, the switch PMOS is turned on when the FD-SEL is ON (H) to turn off the PMOS, to the gate of which the pbias_FD is applied, to make the PMOS not to operate as the load.

By using the selector 46 and the charge pump (CP) 47 depicted in FIG. 16, it is possible to continuously change an output CP out of the charge pump even if the selector 46 (the switches 65 and 66) is switched by the FD-SEL.

Figure 17:
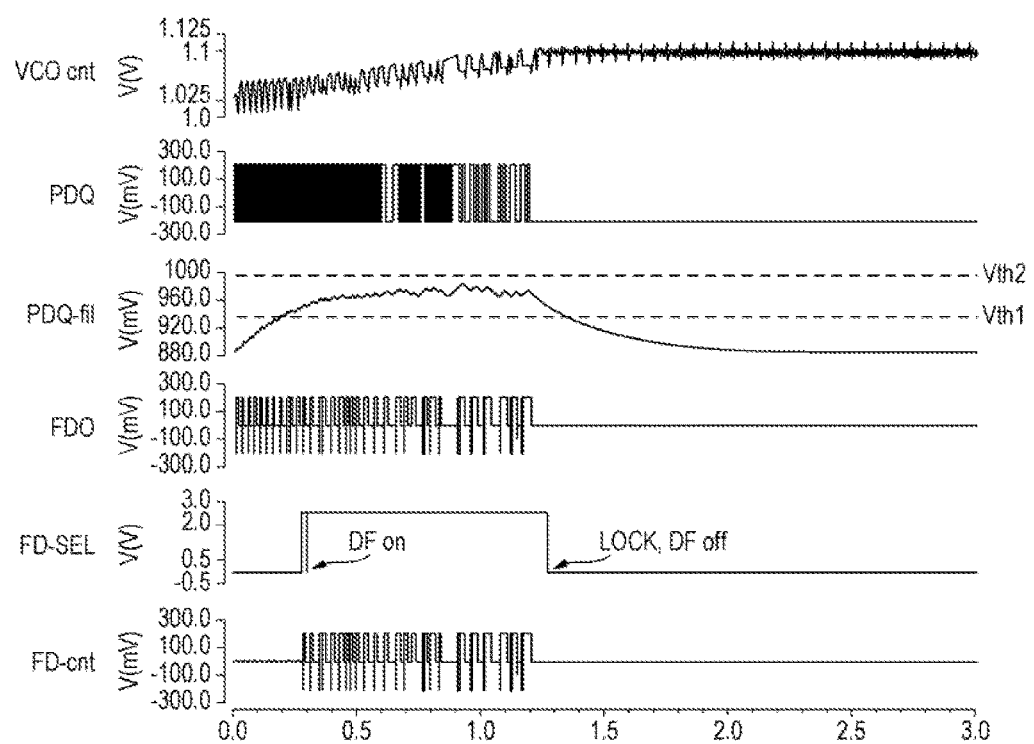
FIG. 17 is a diagram depicting a result of an operation simulation of the CDR circuit in the first embodiment.

FIG. 17 is a diagram depicting a result of an operation simulation of the CDR circuit 40 in the first embodiment. In FIG. 17, operation waveforms of the control signals VCO cnf, PDQ, PDQ-fil, FDO, FD-SEL, and FD-cnt of the VCO 41 are depicted at the time when the CDR circuit 40 starts, changes to the normal lock state, and maintains the state.

After the start of the CDR circuit 40, the VCO 41 increases the oscillation frequency from the self-running frequency. In response to the increase of the oscillation frequency, the PDQ and FDO change and the PDQ-fil increases from zero. However, since the PDQ-fil is smaller than the Vth1, the FD-SEL is OFF and the FD-cnt is zero. When the PDQ-fil exceeds the Vth1, the FD-SEL changes to ON and the FD-cnt outputs the FDO. Therefore, the control voltage of the VCO 41 is generated based on the PDI+FDO.

The oscillation frequency of the VCO 41 approaches the frequency of the input data Data with the control voltage based on the PDI+FDO. Accordingly, the PDQ is fixed to L. Therefore, the PDQ-fil gradually decreases toward L. When the PDQ-fil is smaller than Vth1, the FD-SEL changes to OFF and the FD-cnt becomes zero. Consequently, the CDR circuit 40 changes to the normal lock state. During the normal lock state, even if jitter is present in the Data, since the PDQ-fil is fixed to L, the FD-cnt is zero. As a result, it is possible to restrain occurrence of an error due to FD misdetection. According to a result of actual trial manufacturing and evaluation, the CDR circuit 40 in the first embodiment is capable of restraining error occurrence even when jitter equal to or larger than 0.65 UI is present. When the supply control of FDO to the CP 47 by the FD-cnt is not performed, jitter, error occurrence due to which is capable of being restrained, is 0.45 UI. Allowable jitter is greatly improved. In this way, the CDR circuit 40 is capable of receiving input data having jitter equal to or larger than 0.5 UI.

Figure 18:
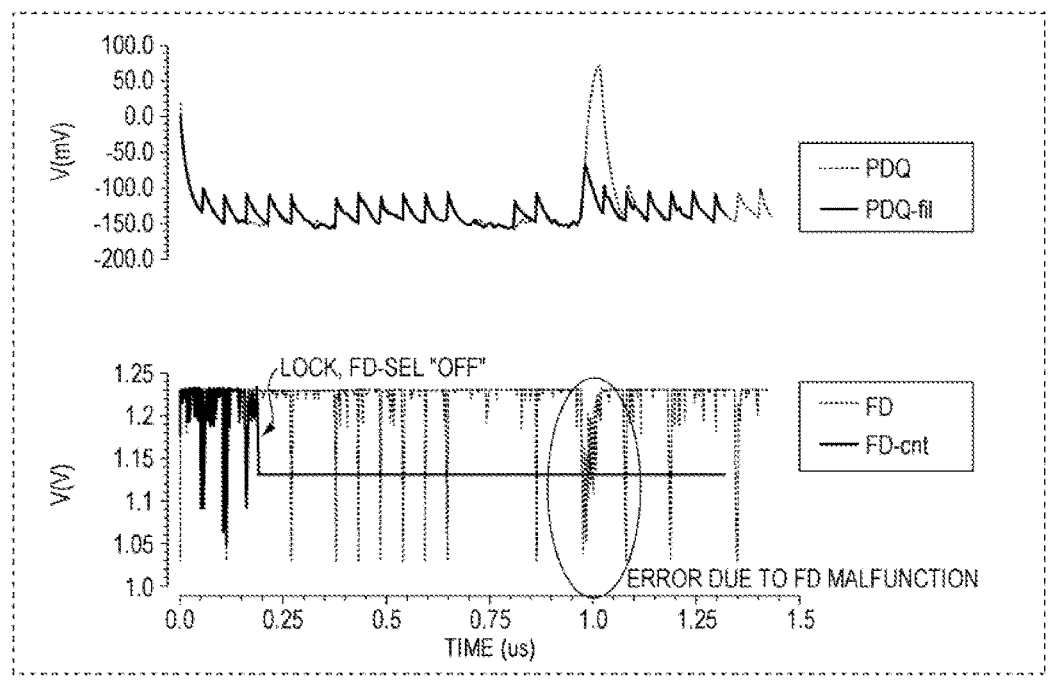
FIG. 18 is a diagram depicting an operation simulation result of the CDR circuit in the first embodiment when large jitter occurs during normal lock.

FIG. 18 is a diagram depicting an operation simulation result of the CDR circuit in the first embodiment at the time when large jitter occurs during the normal lock. Changes in the PDQ and the PDQ-fil are depicted on the upper side and changes in the FD and the FD-cnt are depicted on the lower side. On the upper side, a dotted line indicates the change in the PDQ and a solid line indicates the change in the PDQ-fil. On the lower side, a dotted line indicates the change in the FD and a solid line indicates the change in the FD-cnt.

When converging to the normal lock state, the changes in the PDQ and the PDQ-fil are gradually reduced in amplitude. However, the FD-SEL remains ON. Therefore, the FD sometimes changing in a short pulse shape is outputted as the FD-cnt. When the change in the PDQ-fil enters a predetermined range, it is determined that the CDR circuit 40 is in the lock state. The FD-SEL changes to OFF. When the FD-SEL once changes to OFF, even if the PDQ fluctuates and the FD changes in a short pulse shape, the change in the PDQ-fil is averaged. Therefore, the change in the PDQ-fil is not outside the predetermined range. The FD-SEL maintains the state of ON.

For example, as depicted in FIG. 18, even if the FD-SEL is in the state of OFF and the PDQ and the FD greatly change, the change in the PDQ-fil is relatively small, the FD-SEL is maintained in the state of OFF, and the CDR circuit 40 does not change from the normal lock state. On the other hand, when the supply control to the CP 47 of the FD by the FD-SEL is not performed, the FD is directly supplied to the CP 47 with respect to the short pulse-like change of the FD and, in particular, the large change described above. Therefore, out-of-phase occurs and the CDR circuit 40 changes from the lock state. The feedback operation is performed to change the CDR circuit 40 to the lock state again. A negative cycle occurs in which the FD change and the change to the unlock state due to the large jitter and the return to the lock state are frequency repeated. A stable receiving operation is not performed for a long time. In the CDR circuit 40 in the first embodiment, such a negative cycle does not occur and a stable receiving operation is capable of being performed for a long time.

In the CDR circuit 40 in the first embodiment, the FD mask circuit 45 detects, using the PDQ, in which of the normal lock state, the frequency difference state, and the anti-phase lock state the CDR circuit 40 is. However, the detection may be capable of being performed using the FDO. In a second embodiment described below, the FD mask circuit 45 generates the FD-SEL using the FDO.

Figure 19A:
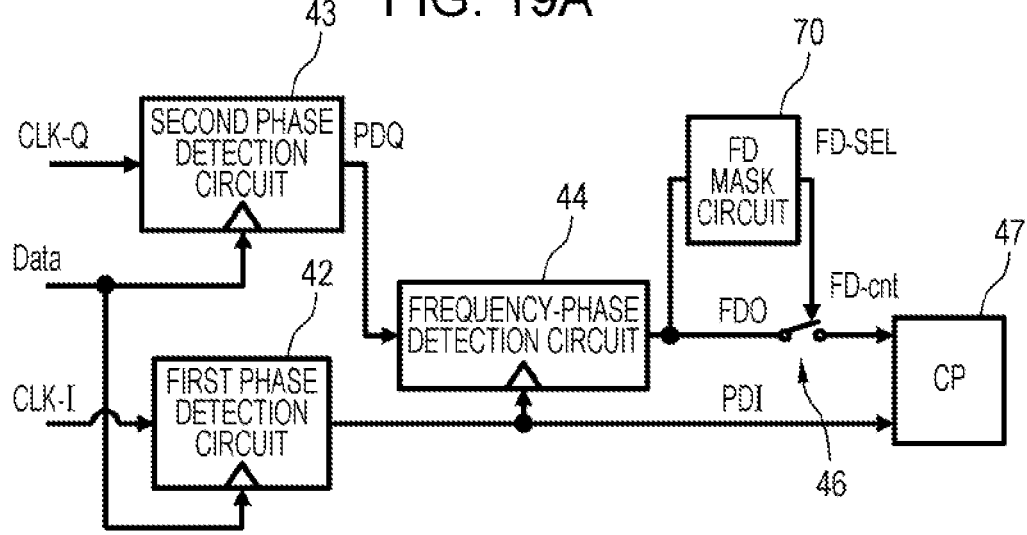
FIGS. 19A to 19C are diagrams depicting a CDR circuit in a second embodiment.
Figure 19B:
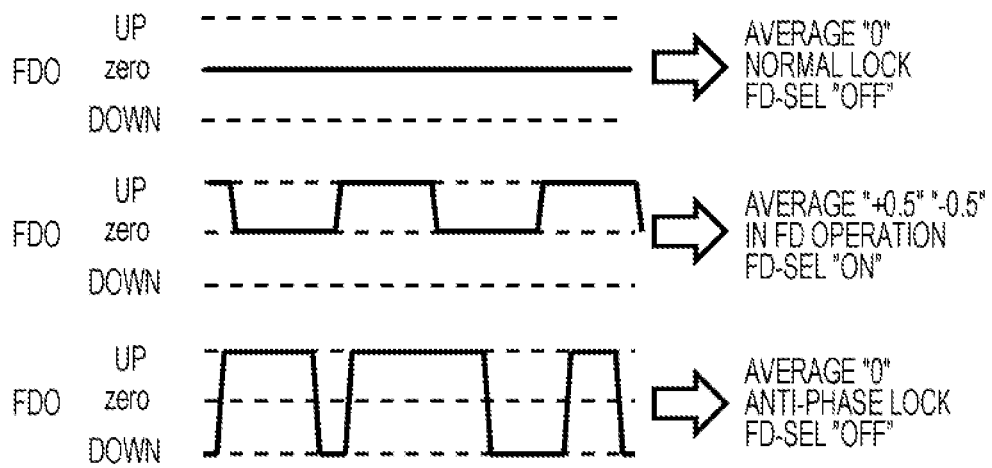
Figure 19C:
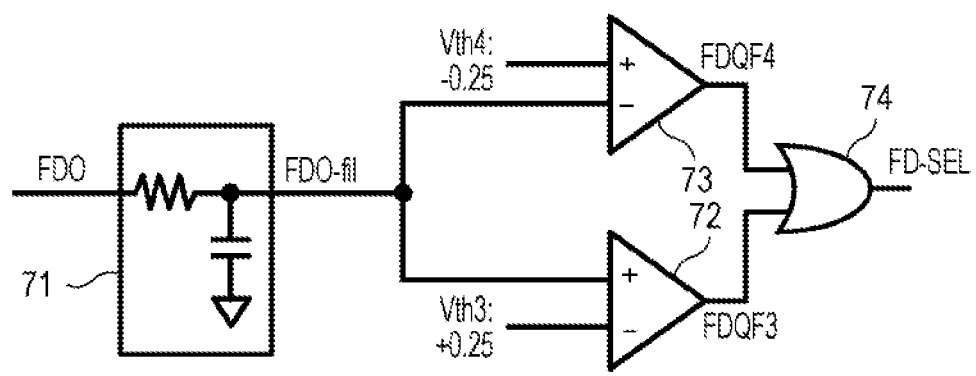

FIGS. 19A to 19C are diagrams depicting a CDR circuit in the second embodiment. FIG. 19A is a circuit block diagram depicting the configuration of portions of first and second phase detection circuits, a frequency-phase detection circuit, an FD mask circuit, a selector, and a CP. FIG. 19B depicts operation waveforms of an FDO. FIG. 19C is a circuit diagram of the FD mask circuit.

The CDR circuit in the second embodiment includes a configuration similar to the configuration of the CDR circuit in the first embodiment depicted in FIG. 9. Only the portion of the FD mask circuit is different. The other portions are the same as the portions in the first embodiment. An FD mask circuit 70 in the second embodiment detects, using a frequency phase signal FDO outputted from the frequency-phase detection circuit 44, in which of a normal lock state, a frequency difference state, and an anti-phase lock state the CDR circuit is, and generates a selection signal FD-SEL.

As depicted in FIG. 19B, the FDO is fixed to zero in the normal lock state. An average of the FDO is zero. In the frequency difference state, the FDO alternately changes between zero and +1 (UP) (during a low oscillation frequency) or zero and −1 (DOWN) (during a high oscillation frequency). An average of the FDO is near +0.5 or −0.5. Further, in the anti-phase lock state, the FDO alternately changes between +1 (UP) and −1. An average of the FDO is zero. As described above, in the normal lock state and the anti-phase lock state, the FD-SEL is changed to OFF to stop the supply of the FDO to the CP 47. In the frequency difference state, the FD-SEL is changed to ON to perform the supply of the FDO to the CP 47. Therefore, the FD mask circuit 70 only has to detect in which of the frequency difference state, the normal lock state, and the anti-phase lock state the CDR circuit is, and generate the FD-SEL. As described above, the average of the FDO is zero in the normal lock state and the anti-phase lock state and is +0.5 or −0.5 in the frequency difference state. Therefore, in the second embodiment, if the average of the FDO is in a range of ±0.25, the FD mask circuit 70 determines that the CDR circuit is in the normal lock state or the anti-phase lock state. If the average of the FDO is outside the range of ±0.25, the FD mask circuit 70 determines that the CDR circuit is in the frequency difference state.

The FD mask circuit 70 in the second embodiment includes, as depicted in FIG. 19C, a low-pass filter 71, comparators 72 and 73, and a NOR gate 74. The low-pass filter 71 is the same as the low-pass filter 51 of the FD mask circuit 45 in the first embodiment depicted in FIG. 14A. However, the input is changed from the PDQ to the FDO. The comparator 72 compares the FDO-fil with a third threshold Vth3 (+0.25). If the FDO-fil is larger than the third threshold Vth3, the comparator 72 outputs H (High) as PDQF3. If the FDO-fil is smaller than the third threshold Vth3, the comparator 72 outputs L (Low) as the PDQF3. The comparator 73 compares the FDO-fil with a fourth threshold Vth4 (−0.25). If the FDO-fil is larger than the fourth threshold Vth4, the comparator 73 outputs L as PDQF4. If the FDO-fil is smaller than the fourth threshold Vth4, the comparator 73 outputs L as the PDQF4. The NOR gate 74 calculates an OR of the PDQF3 and the PDQF4 and outputs the OR as the FD-SEL. Therefore, if the FDO-fil obtained by removing a high-frequency component from the FDO is within a range of a value larger than the Vth4 (+0.25) or smaller than the Vth4 (−0.25), the FD-SEL changes to H (ON). If the FDO-fil is outside the range, the FD-SEL changes to L (OFF). In other words, if the FDO-fil is within the range of the Vth3 (+0.25) and the Vth4 (−0.25), the FD-SEL changes to L (OFF). If the FDO-fil is outside the range, the FD-SEL changes to H (ON).

Other operations and effects in the second embodiment are the same as the operations and the effects in the first embodiment and therefore explanation of the operations and the effects is omitted.

In the first and second embodiments, a circuit that uses the input data Data as a trigger is used as the first phase detection circuit 42 and the second phase detection circuit 43. However, a circuit that uses a clock as a trigger may be used. In a third embodiment described below, a phase detection circuit that uses a clock as a trigger is used.

Figure 20A:
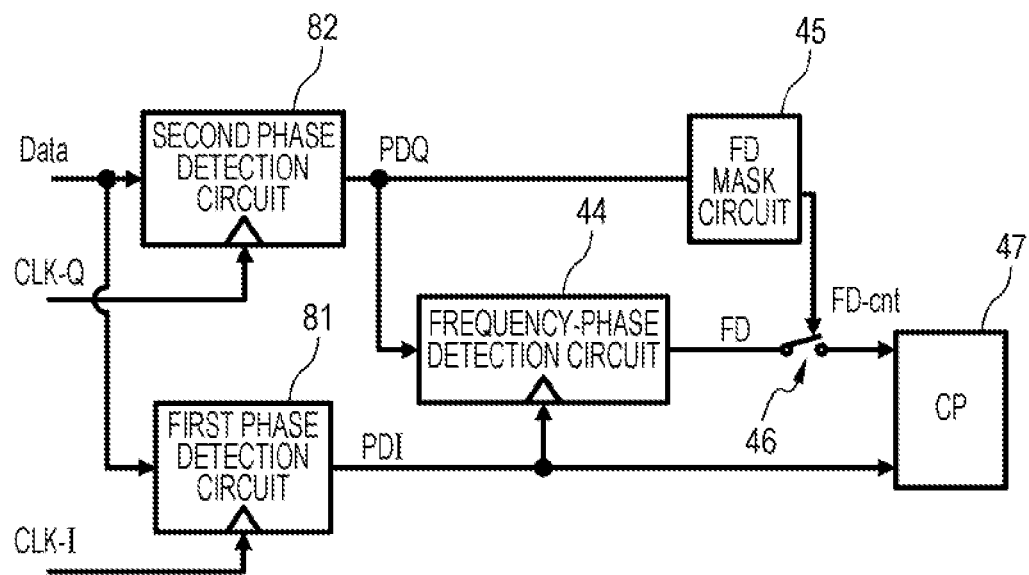
FIGS. 20A and 20B are diagrams depicting a CDR circuit in a third embodiment, FIG. 20A being a circuit block depicting the configuration of portions of first and second phase detection circuits, a frequency-phase detection circuit, an FD mask circuit, a selector, and a CP and FIG. 20B depicting a circuit example of the first phase detection circuit.
Figure 20B:
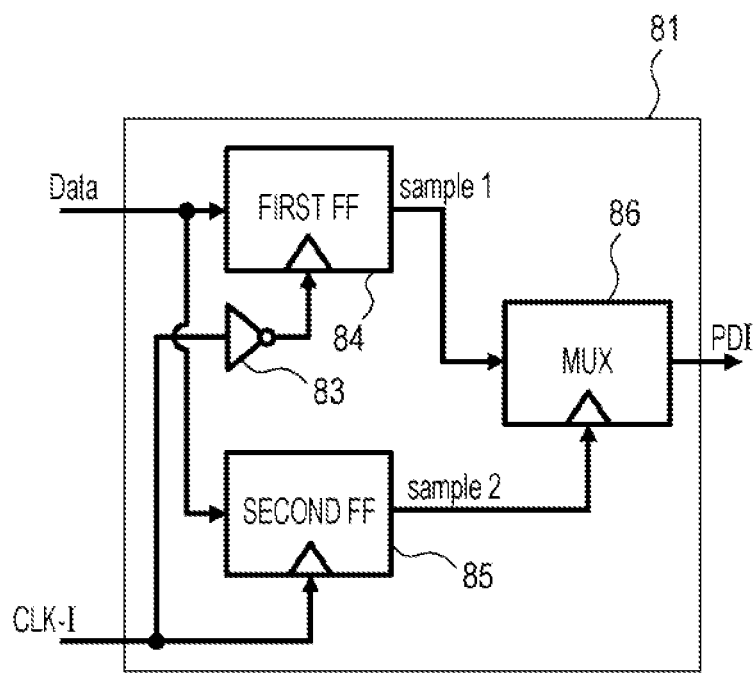

FIGS. 20A and 20B are diagrams depicting a CDR circuit in the third embodiment. FIG. 20A is a circuit block diagram depicting the configurations of portions of first and second phase detection circuits, a frequency-phase detection circuit, an FD mask circuit, a selector, and a CP. FIG. 20B depicts a circuit example of the first phase detection circuit.

The CDR circuit in the third embodiment includes a configuration similar to the configuration of the CDR circuit in the first embodiment depicted in FIG. 9. Only the configurations of the first phase detection circuit and the second phase detection circuit are different. The other components are the same as the components in the first embodiment. A first phase detection circuit 81 detects, using the first clock CLK-I as a trigger, a phase of the input data Data with respect to the change edge of the CLK-I. The second phase detection circuit 82 detects, using the second clock CLK-Q having a frequency the same as the frequency of the CLK-I and in phase advance by 90 degrees as a trigger, a phase of the input data Data with respect to the change edge of the CLK-Q.

As depicted in FIG. 20B, the first phase detection circuit 81 includes an inverter 83, a first flip-flop (FF) 84, a second FF 85, and a multiplexer (MUX) 86. The inverter 83 inverts the CLK-I and outputs /CLK-I. The first FF 84 is an FF that receives the Data as an input and uses the /CLK-I as a trigger. The first FF 84 latches a value of the Data at a rising edge of the /CLK-I and outputs the value as sample1. The second FF 85 is an FF that receives the Data as an input and uses CLK-I as a trigger. The second FF 85 latches a value of the Data at the rising edge of the CLK-I and outputs the value as sample2. The MUX 86 combines the sample1 and the sample2 and generates the clock phase control signal PDI.

The second phase detection circuit 82 includes the configuration depicted in FIG. 20B. The second phase detection circuit 82 is different from the first phase detection circuit 81 in that the CLK-Q is inputted instead of the CLK-I and the clock phase detection signal PDQ is outputted.

When the Data, the CLK-I, and the CLK-Q are differential signals, the phase detection circuit depicted in FIG. 20B is realized like, for example, the phase detector PD discussed in Non-Patent Literature 1.

Other operations and effects in the third embodiment are the same as the operations and the effects in the first and second embodiments. Explanation of the operations and the effects is omitted.

The signal reproduction (CDR) circuits in the first to third embodiments are described above. An apparatus using a CDR circuit in an embodiment is described below.

Figure 21:
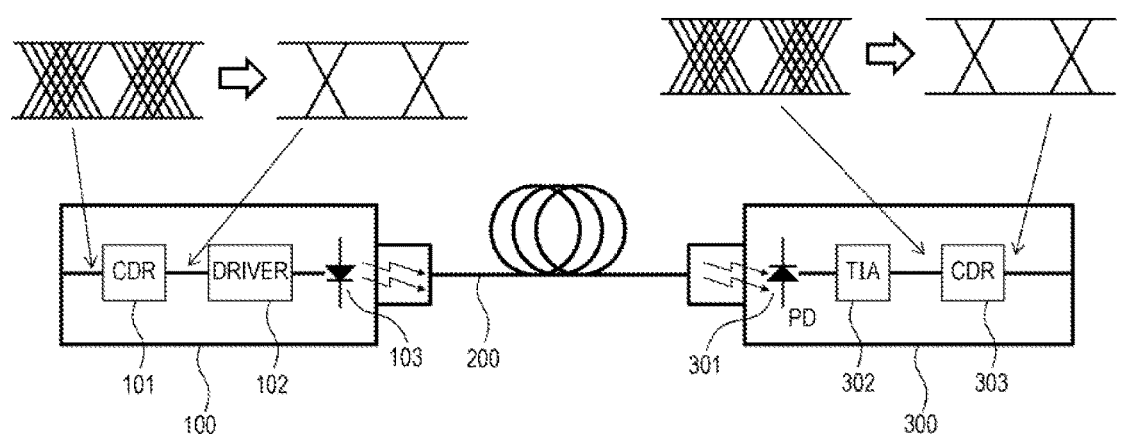
FIG. 21 is a diagram depicting the configuration of an optical communication system using a CDR circuit in an embodiment.

FIG. 21 is a diagram depicting the configuration of an optical communication system using the CDR circuit in the embodiment.

The optical communication system includes a transmitter 100 that converts a transmission signal into an optical signal and outputs the optical signal, an optical fiber 200 that transmits the optical signal outputted from the transmitter 100, and a receiver 300 that receives the optical signal and reproduces a received signal. The transmitter 100 reproduces a transmission signal transmitted from an electronic apparatus or the like and generates an optical signal. The transmitter 100 may be a relay apparatus that, after once converting an optical signal received via an optical fiber into an electric signal, converts the electric signal into an optical signal again and outputs the optical signal. The receiver 300 outputs the reproduced received signal to the electronic apparatus or the like as an electric signal. The receiver 300 may be a relay apparatus that converts a received signal into an optical signal again and outputs the optical signal.

The transmitter 100 includes a signal reproduction (CDR) circuit 101, a driver 102, and a laser diode 103. The signal reproduction (CDR) circuit 101 reproduces a clock from a received data signal and reproduces a transmission data signal. The driver 102 drives the LD 103 in response to the transmission data signal, generates an optical signal, and outputs the optical signal to the optical fiber 200.

The receiver 300 includes a photodiode (PD) 301, a trans-impedance amplifier (TIA) 302, and a signal reproduction (CDR) circuit 303. The PD 301 converts an optical signal received from the optical fiber 200 into an electric reception data signal. The TIA 302 amplifies the reception data signal. The CDR circuit 303 reproduces a clock from the reception data signal and reproduces the reception data signal.

The signal reproduction (CDR) circuit in the embodiments is used as signal reproduction (CDR) circuits 101 and 303 depicted in FIG. 21.

Note that the signal reproduction (CDR) circuit in the embodiments is a circuit that is not only usable in optical communication systems but also applicable to any circuit that performs transmission and reception of a data signal modulated in synchronization with a clock on the inside and the outside of electronic apparatuses. When the clock is reproduced from the data signal, the signal reproduction (CDR) circuit. For example, the signal reproduction (CDR) circuit is usable in a field in which a further increase in a bit rate is desired such as a field of high-speed I/O for transmitting and receiving signals in an integrated circuit chip and between chips (in an apparatus and between apparatuses).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal reproduction circuit comprising:
   an oscillator configured to generate a frequency-variable first clock and a second clock having a frequency the same as a frequency of the first clock and having a phase different from a phase of the first clock; and
   a feedback circuit configured to control the oscillator in accordance with a phase relation and a frequency relation between input data and the first clock such that the input data and the first clock synchronize with each other, wherein
   the feedback circuit includes:
   a controller configured to control the oscillator in accordance with the phase relation between the input data and the first clock,
   a first phase detection circuit configured to generate a clock phase control signal in accordance with the phase relation between the input data and the first clock,
   a second phase detection circuit configured to generate a clock phase detection signal in accordance with a phase relation between the input data and the second clock,
   a frequency-phase detection circuit configured to compare the clock phase control signal and the clock phase detection signal and generate a frequency phase signal indicating the frequency relation between the input data and the first clock,
   a state detection circuit configured to detect, using the clock phase detection signal or the frequency phase signal, a lock state in which falling edges or rising edges of the input data and the first clock synchronize with each other and a frequency difference state in which frequencies of the input data and the first clock are different from each other, and
   a selector configured to switch between supplying the frequency phase signal to the controller in the frequency difference state and not supplying the frequency phase signal to the controller in the lock state.

2. The signal reproduction circuit according to claim 1, wherein the second clock has the phase different from the phase of the first clock by 90 degrees.

3. The signal reproduction circuit according to claim 1, wherein
   the state detection circuit includes:
   a low-pass filter configured to extract a low-frequency component from the clock phase detection signal; and
   an arithmetic circuit configured to detect whether an output of the low-pass filter is within a certain level range including an intermediate level, and
   the state detection circuit determines that the signal reproduction circuit is in the frequency difference state when the output of the low-pass filter is within the certain level range and determines that the signal reproduction circuit is in the lock state when the output of the low-pass filter is outside the certain level range.

4. The signal reproduction circuit according to claim 1, wherein
   the state detection circuit includes:
   a low-pass filter configured to extract a low-frequency component from the frequency phase signal; and
   an arithmetic circuit configured to detect whether an output of the low-pass filter is outside a certain level range including an intermediate level, and
   the state detection circuit determines that the signal reproduction circuit is in the frequency difference state when the output of the low-pass filter is outside the certain level range and determines that the signal reproduction circuit is in the lock state when the output of the low-pass filter is within the certain level range.

5. An electronic apparatus comprising a signal reproduction circuit configured to reproduce a clock from received input data and capture the input data based on the reproduced clock, wherein
   the signal reproduction circuit includes:
   an oscillator configured to generate a frequency-variable first clock and a second clock having a frequency the same as a frequency of the first clock and having a phase different from a phase of the first clock; and a feedback circuit configured to control the oscillator in accordance with a phase relation and a frequency relation between input data and the first clock such that the input data and the first clock synchronize with each other, wherein
the feedback circuit includes:
a controller configured to control the oscillator in accordance with the phase relation and the frequency relation between the input data and the first clock;
a first phase detection circuit configured to generate a clock phase control signal in accordance with the phase relation between the input data and the first clock;
a second phase detection circuit configured to generate a clock phase detection signal in accordance with a phase relation between the input data and the second clock;
a frequency-phase detection circuit configured to compare the clock phase control signal and the clock phase detection signal and generate a frequency phase signal indicating the frequency relation between the input data and the first clock;
a state detection circuit configured to detect, using the clock phase detection signal or the frequency phase signal, a lock state in which falling edges or rising edges of the input data and the first clock synchronize with each other and a frequency difference state in which frequencies of the input data and the first clock are different from each other; and
a selector configured to switch between supplying the frequency phase signal to the controller in the frequency difference state and not supplying the frequency phase signal to the controller in the lock state.

6. A signal reproducing method of reproducing a clock from received input data, the signal reproducing method comprising:
generating a frequency-variable first clock and a second clock having a frequency the same as a frequency of the first clock and having a phase different from a phase of the first clock; and
generating a clock phase control signal in accordance with a phase relation between the input data and the first clock;
generating a clock phase detection signal in accordance with a phase relation between the input data and the second clock;
comparing the clock phase control signal and the clock phase detection signal and generating a frequency phase signal indicating a frequency relation between the input data and the first clock;
detecting, using the clock phase detection signal or the frequency phase signal, a lock state in which falling edges or rising edges of the input data and the first clock synchronize with each other and a frequency difference state in which frequencies of the input data and the first clock are different from each other; and
performing feedback control for controlling the frequency of the first clock in accordance with the clock phase control signal such that the input data and the first clock synchronize with each other, using the frequency phase signal for the feedback control together with the clock phase control signal in the frequency difference state, and performing the feedback control only with the clock phase control signal in the lock state.

* * * * *